United States Patent
Hollis et al.

(10) Patent No.: US 8,510,092 B2
(45) Date of Patent: Aug. 13, 2013

(54) RECURSIVE SUMMATION ALGORITHMS USEFUL FOR STATISTICAL SIGNAL ANALYSIS OF TRANSMISSION OF SIGNALS IN A COMPUTER SYSTEM

(75) Inventors: Timothy M. Hollis, Meridian, ID (US); J. Matthew Tanner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 12/986,280

(22) Filed: Jan. 7, 2011

(65) Prior Publication Data
US 2012/0179434 A1    Jul. 12, 2012

(51) Int. Cl.
*G06G 7/62* (2006.01)
*G06F 17/10* (2006.01)
*H03K 5/125* (2006.01)
*H04B 15/00* (2006.01)

(52) U.S. Cl.
USPC ........ 703/14; 703/2; 703/4; 703/13; 708/320; 375/316; 375/348

(58) Field of Classification Search
None
See application file for complete search history.

(56) References Cited

U.S. PATENT DOCUMENTS

| | | | |
|---|---|---|---|
| 4,944,009 A * | 7/1990 | Micali et al. | 380/46 |
| 6,137,293 A | 10/2000 | Wu et al. | |
| 6,951,001 B2 | 9/2005 | Chen | |
| 7,251,791 B2 | 7/2007 | Wang | |
| 7,290,022 B2 * | 10/2007 | Mattes et al. | 708/320 |
| 7,693,691 B1 | 4/2010 | Tao et al. | |
| 7,720,654 B2 | 5/2010 | Hollis | |
| 2005/0097420 A1 * | 5/2005 | Frisch et al. | 714/742 |
| 2006/0188045 A1 * | 8/2006 | Nygaard, Jr. | 375/348 |
| 2009/0094302 A1 | 4/2009 | Hollis | |
| 2009/0110116 A1 | 4/2009 | Hollis | |
| 2012/0016650 A1 * | 1/2012 | Hollis | 703/13 |
| 2012/0016651 A1 * | 1/2012 | Hollis | 703/13 |

OTHER PUBLICATIONS

Lin, Shen; Kuh, Ernest S. "Transient Simulation of Lossy Interconnects Based on the Recursive Convolution Formuation" IEEE Transactions on Circuits and Systems, vol. 39, No. 11, (Nov. 1992).*
Ren, JiHong; Oh, Kyung Suk "Multiple Edge Responses for Fast and Accurate System Simulations" IEEE Transactions on Advanced Packaging, vol. 31, No. 4 (Nov. 2008).*
U.S. Appl. No. 12/838,144, filed Jul. 16, 2010, Hollis.
U.S. Appl. No. 12/838,120, filed Jul. 16, 2010, Hollis.
B. Casper et al., "An Accurate and Efficient Analysis Method for Multi-Gb/s Chip-to-Chip Signaling Schemes," 2002 Symposium on VLSI Circuits Digest of Technical Papers, pp. 54-57 (2002).
Stateye V.4.2.3 Documentation (2007).
Nexxim product by Ansoft (http://www.ansoft.com/products/hf/nexxim/) (2010).
Advanced Design System product by Agilent (http://www.home.agilent.com/agilent/product.jspx?cc=US&lc=eng&ckey=1297113&nid=-34346.0.00&id=1297113) (2000-2010).

* cited by examiner

*Primary Examiner* — Kamini S Shah
*Assistant Examiner* — Jay B Hann
(74) *Attorney, Agent, or Firm* — Schwegman, Lundberg & Woessner, P.A.

(57) ABSTRACT

Computer-implementable recursive summation algorithms are disclosed that are useful for efficiently performing recursive convolution, such as is often required in Statistical Signal Analysis (SSA) techniques. The disclosed recursive summation algorithms can be more computationally-efficient from both a speed and memory perspective than other recursive convolution techniques known in the prior art, such as the techniques relying on Fast Fourier Transforms (FFTs).

19 Claims, 19 Drawing Sheets

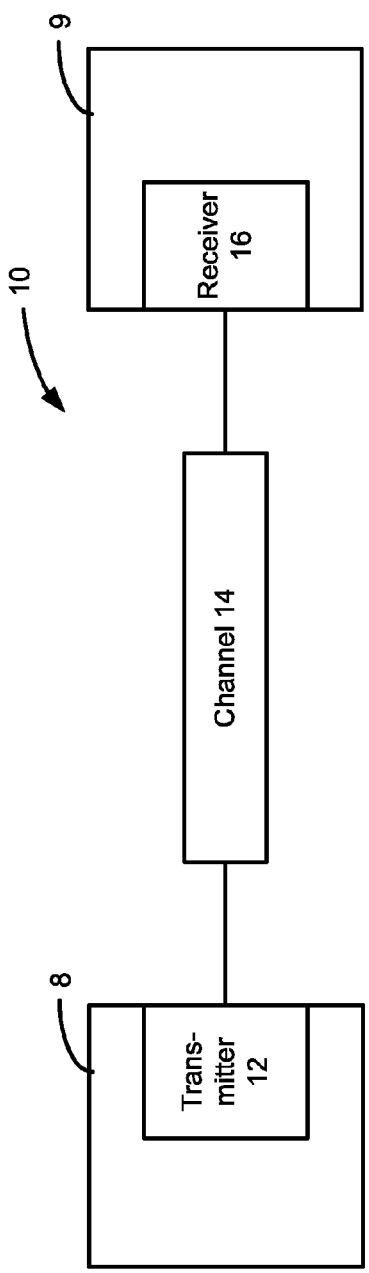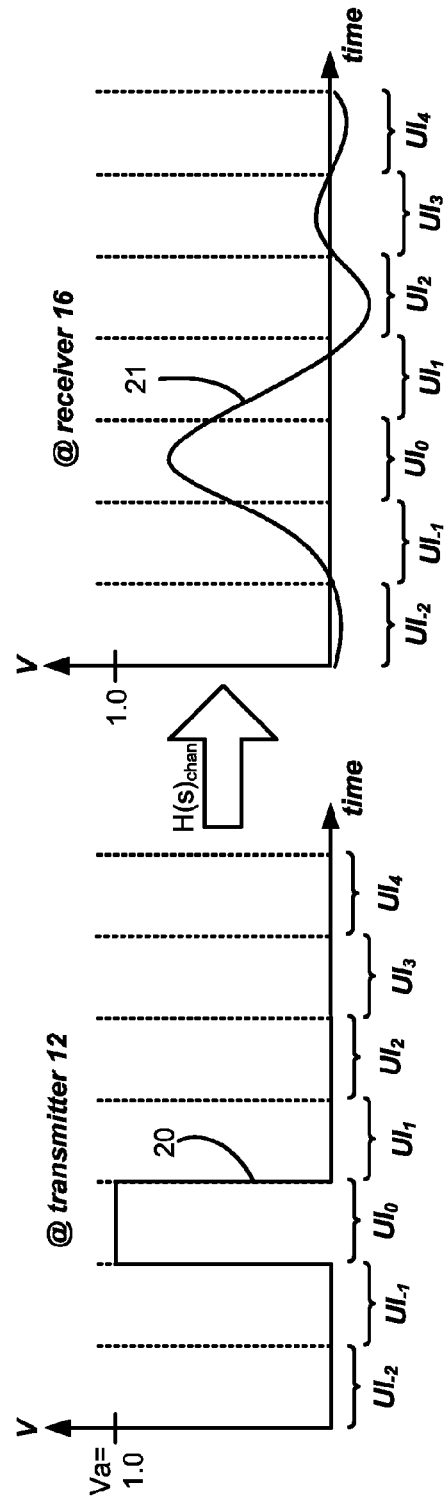
Figure 1 (Prior Art)
Figure 2 (Prior Art)

Vec = [X(i)$_0$, X(i)$_1$, X(i)$_2$, X(i)$_3$, ... X(i)$_{N-1}$]  (length = N)

Out = [V$_1$(i), V$_2$(i), V$_3$(i), ... V$_{16}$(i)]  (length = $2^N$)

Sum = [Sum$_0$, Sum$_1$, Sum$_2$, ... Sum$_j$]  (length = N+1)

Recsum (0,0) ⟶ $\Big\{$ Recsum (Sum$_j$, j)
 if j ≥ N
  append Sum$_j$ to Out
 else
  Recsum (Sum$_j$, j+1)
  Recsum (Sum$_j$ + X(i)$_j$, j+1)

*Figure 6*

Vec = [$X(i)_0$=4, $X(i)_1$=3, $X(i)_2$=2, $X(i)_3$=1]  (N = 4)

Recsum₁ ($Sum_0$=0, j=0)
    if j ≥ 4
        append $Sum_0$ to Out
    else
        *Recsum ($Sum_0$=0, j=1)*
        Recsum ($Sum_0$=4 (0+$X(i)_0$), j=1)

Sum | 0 |   |   |   |
Out |   |   |   |   | •••

Recsum₂ ($Sum_1$=0, j=1)
    if j ≥ 4
        append $Sum_1$ to Out
    else
        *Recsum ($Sum_1$=0, J=2)*
        Recsum ($Sum_1$=3 (0+$X(i)_1$), j=2)

Sum | 0 | *0* |   |   |
Out |   |   |   |   | •••

Recsum₃ ($Sum_2$=0, j=2)
    if j ≥ 4
        append $Sum_2$ to Out
    else
        *Recsum ($Sum_2$=0, j=3)*
        Recsum ($Sum_2$=2 (0+$X(i)_2$), j=3)

Sum | 0 | 0 | *0* |   |
Out |   |   |   |   | •••

Recsum₄ ($Sum_3$=0, j=3)
    if j ≥ 4
        append $Sum_3$ to Out
    else
        *Recsum ($Sum_3$=0, j=4)*
        Recsum ($Sum_3$=1 (0+$X(i)_3$), j=4)

Sum | 0 | 0 | 0 | *0* |
Out |   |   |   |   | •••

Recsum₅ ($Sum_4$=0, j=4)
    if j ≥ 4
        *append $Sum_4$=0 to Out*
    else n/a Sum | 0 | 0 | 0 | 0 | *0* |
Out | *0* |   |   |   | •••

Recsum₄ ($Sum_3$=0, j=3)
    if j ≥ 4
        append $Sum_3$ to Out
    else
        Recsum ($Sum_3$=0, j=4)
        *Recsum ($Sum_3$=1, j=4)*

Sum | 0 | 0 | 0 | *1* | 0 |
Out | 0 |   |   |   | •••

*Figure 7A*

Recsum$_2$ (Sum$_1$=0, j=1)
    if j ≥ 4
        append Sum$_1$ to Out
    else
        Recsum (Sum$_1$=0, j=2)
        Recsum (Sum$_1$=3, j=2)

Sum | 0 | *3* | 2 | 3 | 3 |
Out | 0 | 1 | 2 | 3 |   | •••

Recsum$_{10}$ (Sum$_2$=3, j=2)
    if j ≥ 4
        append Sum$_2$ to Out
    else
        Recsum (Sum$_2$=3, j=3)
        Recsum (Sum$_2$=5 (3+X(i)$_2$), j=3)

Sum | 0 | 3 | *3* | 3 | 3 |
Out | 0 | 1 | 2 | 3 |   | •••

Recsum$_{11}$ (Sum$_3$=3, j=3)
    if j ≥ 4
        append Sum$_3$ to Out
    else
        Recsum (Sum$_3$=3, j=4)
        Recsum (Sum$_3$=4 (3+X(i)$_3$), j=4)

Sum | 0 | 3 | 3 | *3* | 3 |
Out | 0 | 1 | 2 | 3 |   | •••

Recsum$_{12}$ (Sum$_4$=3, j=4)
    if j ≥ 4
        append Sum$_4$=3 to Out
    else n/a Sum | 0 | 3 | 3 | 3 | *3* |
Out | 0 | 1 | 2 | 3 | *3* | •••

Recsum$_{11}$ (Sum$_3$=3, j=3)
    if j ≥ 4
        append Sum$_3$ to Out
    else
        Recsum (Sum$_3$=0, j=3)
        Recsum (Sum$_3$=4, j=4)

Sum | 0 | 3 | 3 | *4* | 3 |
Out | 0 | 1 | 2 | 3 |   | •••

Recsum$_{13}$ (Sum$_4$=4, j=4)
    if j ≥ 4
        append Sum$_4$=4 to Out
    else n/a Sum | 0 | 3 | 3 | 3 | *4* |
Out | 0 | 1 | 2 | 3 | 3 | *4* | •••

*Figure 7C* 

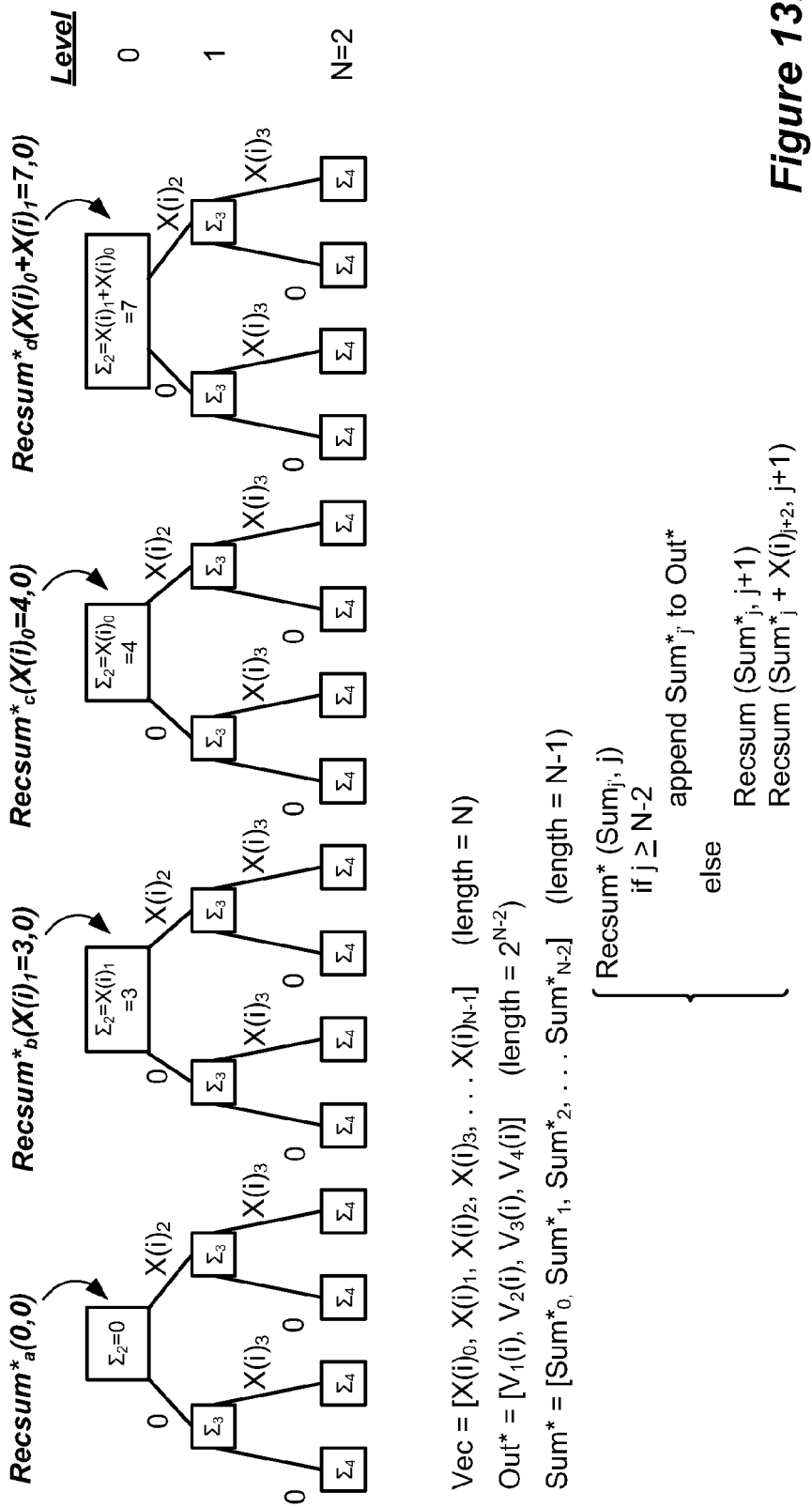

US 8,510,092 B2

RECURSIVE SUMMATION ALGORITHMS USEFUL FOR STATISTICAL SIGNAL ANALYSIS OF TRANSMISSION OF SIGNALS IN A COMPUTER SYSTEM

FIELD OF THE INVENTION

This invention relates to improved methods for simulating the transmission of signals in a computer system.

BACKGROUND

Circuit designers of multi-Gigabit systems face a number of challenges as advances in technology mandate increased performance in high-speed components. At a basic level, data transmission between high-speed components within a single semiconductor device or between two devices on a printed circuit board may be represented by the system 10 shown in FIG. 1. In FIG. 1, a transmitter 12 at a transmitting device 8 (e.g., a microprocessor) sends data over a transmission channel 14 (e.g., a copper trace on a printed circuit board or "on-chip" in a semiconductor device) to a receiver 16 at a receiving device 9 (e.g., another processor or memory). When data is sent from an ideal transmitter 12 to a receiver 16 across an ideal (lossless) channel, all of the energy in a transmitted pulse will be contained within a single time cell called a unit interval (UI).

However, real transmitters and real transmission channels do not exhibit ideal characteristics, and the effects of transmission channels are becoming increasingly important in high-speed circuit design. Due to a number of factors, including, for example, the limited conductivity of copper traces, the dielectric medium of the printed circuit board (PCB), and the discontinuities introduced by vias, the initially well-defined digital pulse will tend to spread or disperse as it passes along the channel 14. This is shown in FIG. 2. As shown, a single ideal positive pulse 20 is sent by the transmitter 12 during a given UI (e.g., $UI_0$). However, because of the effect of the channel 14, this data pulse 20 becomes spread 21 over multiple UIs at the receiver 16, i.e., some portion of the energy of the pulse is observed outside of the UI in which the pulse was sent (e.g., in $UI_{-1}$ and $UI_1$). This residual energy outside of the UI of interest may perturb a pulse otherwise occupying either of the neighboring UIs in a phenomenon referred to as intersymbol interference (ISI).

Due to several factors associated with the complexity in designing, building, and testing such circuitry, it is a common practice in the art of integrated circuit design to simulate the operation of a circuit using a computer system. Simulation software allows the circuit designer to verify the operation and margins of a circuit design before incurring the expense of actually building and testing the circuit. Simulation is particularly important in the semiconductor industry, where it is generally very expensive to design and produce a given integrated circuit. Through the use of simulations, design errors or risks are hopefully identified early in the design process, and resolved prior to fabrication of the integrated circuit.

A traditional approach used to simulate the transmission of a signal down a channel required the designer to first produce an input waveform to the channel to be simulated. Such an input waveform would typically comprise a number of UIs, representing a bit stream. To ensure that the simulation would assess a significant amount of variation in the bit stream, the produced bit stream would typically comprise a random, or at least pseudo-random, sequence of logic levels (e.g., 00100101101011 . . . ). Typically, the goal of channel simulation is to assess whether the system 10 in question can reliably transmit and receive bits at a suitable Bit Error Ratio (BER); permissible error rates in modern-day systems might comprise $10^{-12}$ (i.e., one bit error in a trillion) or less.

To be able to resolve BERs in a statistically significant fashion, the number of UIs in the produced input waveform would have to be even higher than the inverse of the BER, for example, at least $10^{13}$ cycles or so. Moreover, a realistic simulation would preferably not assume that the logic states in the input waveform were at perfect voltage levels, nor would it assume that transitions between logic states would always occur with perfect timing or with a uniform slew rate. Thus, the designer, using various methods or computerized tools, might additionally seek to add amplitude or timing variation to the input waveform. When one considers the large number of UIs required in the input waveform in light of the BER, and the desirability of adding variation to the input waveform, production of the input waveform using traditional techniques is difficult, and very computationally intensive. Memory in the computer system used by the designer could easily be exhausted, and computer simulation times for an input signal of such great length could easily be prohibitive.

Because of the impracticality of production and simulation of an input waveform in this manner, the industry has turned to various forms of statistical signaling analysis (SSA). An example of SSA is disclosed in B. Casper et al., "An Accurate and Efficient Analysis Method for Multi-Gb/s Chip-to-Chip Signaling Schemes," 2002 Symposium on VLSI Circuits Digest of Technical Papers, pp. 54-57 (2002), which is submitted in the Information Disclosure statement accompanying the filing of this disclosure, and which technique is summarized in FIGS. 3A-3E.

Casper's technique assumes a particular transfer function, $H(s)_{chan}$, for the channel 14, which transfer function models the capacitance, resistance, and other parameters of the channel. By entering such transfer function information and other modeling information into a computer system, as is typical, the effects of the channel 14 on an idealized positive pulse 20 are simulated, resulting in a positive pulse response 21. An example positive pulse response 21 is seen in further detail in FIG. 3A, and is described as a function X. As was the case in FIG. 2, the majority of the energy of the distorted positive pulse 21 occurs in $UI_0$, which corresponds to the UI of the ideal positive pulse 20, and which may be referred to as the cursor UI for short. Some energy also occurs before $UI_0$, e.g., in unit intervals $UI_{-1}$ and $UI_{-2}$, which may be referred to as pre-cursor UIs. Likewise, some energy occurs after $UI_0$, e.g., in unit intervals $UI_1$ and $UI_2$, which may be referred to as post-cursor UIs.

The positive pulse response 21, X, may be described as a series of discrete points, each referenced to a particular time 'i' in the unit intervals. Index 'i' is shown in FIG. 3A such that the points are roughly in the middle of each UI, but this is merely illustrative. These points may be modeled as a series of delta functions occurring at each of the UIs, as shown in the equation at the top of FIG. 3A, with each delta function being scaled by the magnitude of the positive pulse response 21 at that UI. Such delta function scaling is commonly utilized in digital signal processing sampling theory. Viewed more simply, and as is more convenient for simulation in a computer system, the positive pulse response 21 may also be characterized as a vector containing each of the magnitude components (e.g., [ . . . $X(i)_{-2}$, $X(i)_{-1}$, $X(i)_0$, $X(i)_1$, $X(i)_2$ . . . ] or [ . . . −0.025, 0.15, 0.75, 0.2, −0.15 . . . ] to use the voltage values actually illustrated). How many magnitude terms are used, or how long the vector will be, is a matter of preference, but would logically incorporate the bulk of the positive pulse response 21. More terms will improve the accuracy of the analysis to follow, but will require additional computing resources.

Also shown in FIG. 3A is a zero response 22, Z, which characterizes the transmission of a logical '0' across the channel. As can be seen, this zero response 22 assumes that the channel 14 has no effect, and as such the resulting magnitude values Z(i) are all set to zero. Although seemingly uninteresting, the zero response 22 is used in Casper's technique along with the positive pulse response 21 to generate statistics regarding receipt of data at the receiver 16, as will be seen below.

From the positive pulse response 21 and the zero response 22, i.e., from vectors X(i) and Z(i), Casper's technique derives a probability distribution function (PDF) at time T as shown in FIGS. 3B and 3C, which PDF(i) is meant to simulate where the receiver 16 could statistically expect to see signal voltage values occurring at the end of the channel 14 assuming repeated sampling at a fixed time interval. Casper's technique uses convolution to derive the PDF(i), as illustrated in some detail in FIG. 3B, and more specifically involves a recursive convolution of various pairs of corresponding terms X(i) and Z(i) in the positive pulse response 21 and the zero response 22. Take for example the terms corresponding to the cursor UI $X(i)_0$ and $Z(i)_0$. Because these terms both occur within the same UI, $UI_0$, they are written in FIG. 3B as a pair $(X(i)_0, Z(i)_0)$ or (0.75, 0) to use the actual illustrated values. This pair recognizes that the receiver could expect to see a value of 0.75 if a logic '1' was transmitted, or a value of zero if a logic '0' was transmitted, and assumes that only one sample is taken during the UI and that in a random data stream reception of either of these values are equally probable. Thus, this pair can be represented as a PDF having two delta functions, one each at values 0.75 and 0, and each having a magnitude of 0.5 (50%). Likewise, and working with the pre-cursor interval pairs first, the next pair $(X(i)_{-1}, Z(i)_{-1})$ or (0.15, 0) can also be represented as a PDF having two delta functions. These two pairs can then be convolved as shown, resulting in yet another PDF illustrating the now four possibilities for the received voltages (0, 0.15, 0.75, and 0.9), each with a probability of 0.25 (25%). Convolution (represented herein using an asterisk symbol '*') is a well-known mathematical technique for cross-correlating two functions, and is assumed familiar to the reader. Convolution is a linear operation, and therefore relies on the mathematical assumption that the system under analysis is linear, time-invariant (LTI), a well-known and common assumption. Introduction of system nonlinearities introduces errors during the calculation process. It should be understood that the PDF resulting from the convolution is appropriately scaled to achieve a sum total probability of 1.

This resulting PDF can then be convolved with a third pair of terms $(X(i)_{-2}, Z(i)_{-2})$ or (−0.025, 0), resulting in a new PDF with eight values, each with probabilities of 0.125 (12.5%), and so on until all of the pre-cursor pairs have been convolved. Thereafter, and as shown in the formula in FIG. 3B, the post-cursor pairs are similarly recursively convolved, until all pairs of interest have been treated. (It bears noting here that convolution is commutative, and therefore it does not matter in which order the various pairs are convolved). Eventually, when all of the pairs of terms have been recursively convolved, the result is a final PDF at time 'i,' as illustrated in FIG. 3C. Because an actual PDF, as calculated this way in a computer system, will likely have discrete values, curve fitting can be used to arrive at a PDF which is smooth, as shown in FIG. 3C. As would be expected, the resulting PDF is bi-modal, comprising two lobes corresponding to the received voltages for the transmission of a logic '1' and/or '0' across the channel 14, which again are assumed to be transmitted with equal probabilities, such that each lobe encompasses an area of 0.5 (50%). Although the PDF lobes, as illustrated in FIG. 3C, appear Gaussian, the actual resulting shape will depend on the particulars of the channel 14 being simulated.

(It should be noted that the length of Vectors X(i) and Z(i) factor into the computation time because they define how many convolution operations are carried out. But they do not explicitly determine the length of the vectors being convolved. For example, when convolving $(X(i)_0, Z(i)_0)$ or (0.75, 0) with $(X(i)_{-1}, Z(i)_{-1})$ or (0.15, 0), the actual vectors being convolved are comprised of unit delta functions at locations 0 and 0.75 and 0 and 0.15 with zeros inserted between the delta functions. These zeros act as placeholders for possible convolution data outputs and are determined by the location of the non-zero delta function divided by the desired voltage resolution. For example, assuming a voltage resolution of 5 mV, the representation of $(X(i)_0, Z(i)_0)$ or (0.75, 0) would have 0.75/0.005=150 place holder zeros between the delta functions, for a total vector length of 151.

Once the PDF is determined for a particular time 'i', 'i' can be changed, allowing for new terms X(i) and Z(i) to be determined from responses 21 and 22, and for a new PDF to be determined. The cumulative effect is illustrated in FIG. 3D, which shows the PDFs as determined for different values of 'i' across the cursor UI. As would be expected, the lobes of the PDFs are sharper and better separated near the center of the UI, signifying that the resolution at the receiver 16 between logic '1' and '0' is statistically easier in such areas. Toward the edges of the UI, the lobes are closer and broader, indicating that the resolution at the receiver 16 between logic '1' and '0' is statistically more difficult.

These PDFs in sum allow the reliability with which data is received at the receiver 16 to be analyzed. Such data also allows sensing margins 25 to be set, and Bit Error Ratios to be deduced. For example, on the basis of the PDFs illustrated in FIG. 3D, it may be decided that the receiver 16 should sample received data anywhere between $t_1$=45 ps to $t_2$=55 ps within the UI, and use a reference voltage between $Vref_1$=0.34 and $Vref_2$=0.41V to discern between logic '0's and '1's, because the statistics of the PDFs indicate an acceptable Bit Error Ratio (e.g., no more than 1 error in $10^{12}$ bits) within these margins 25. As such, Casper's technique is similar in nature to "eye diagrams" (FIG. 3E) also used to assess data reception reliability, and to set appropriate sensing margins. See, e.g., U.S. Patent Application Publication 2009/0110116, discussing eye diagrams in further detail. In an eye diagram, successive UIs of a simulated or measured received signal (usually, a random bit stream) are overlaid to see where the signal occurs, and where a clear "eye" exists within the margins. To generate an eye diagram prior to fabrication, the designer must simulate the data transmission over millions-to-trillions of cycles to arrive at statistically significant Bit Error Ratios. Casper's technique, by contrast, doesn't require randomizing the input data, and thus provides a simpler method to, in effect, generate an "eye" to characterize a channel without the need for simulation of an actual randomized bit stream of data. Instead, only simulation of the transmission of a single ideal positive pulse 20, and analysis of the resulting positive pulse response 21, is needed.

Thus, Casper's technique requires the simulation of only a single ideal pulse, and otherwise extracts the necessary statistical information need to generate an eye diagram (and hence a BER) from the received response. This differs greatly from the traditional approach below which required the generation and simulation of large, computationally difficult, input waveforms. Extensions of Casper's basic technique are also disclosed in U.S. patent application Ser. Nos. 12/838,144 and 12/838,120, both filed Jul. 16, 2010, both of which are owned by the present assignee and incorporated herein by reference.

However, Casper's technique can also be computationally difficult because of the recursive convolution involved. Assume that recursive convolution is to occur with respect to a vector having N terms (or, more precisely, N (X(i), 0) terms, where N equals the number of unit intervals of interest in the positive pulse response for example), and a total length of K (where zero placeholder values have been inserted into the vector as discussed above). A Fast Fourier Transform (FFT) algorithm can be used to perform the recursive convolution calculation, which requires 2M*log 2M+M mathematical operations, where M is the next power of two greater than K. This technique is known, and is therefore only briefly described: the vector is converted to the frequency domain; an element-by-element multiplication of the resulting terms in the spectra is performed; and the resulting spectrum is converted back into the time domain using an inverse FFT. Because this must be repeated until all N terms are accounted for, the total number of computations can be approximated as N*(2M*log 2M+M).

Even with the benefit of an FFT, the number of calculations required in Casper's technique can still be extensive. Significant channel distortion effects such as ISI can often be felt in UIs distant from the cursor UI, and therefore the vector involved in the recursive convolution can have many terms. Moreover, and as pointed out about, the recursive convolution needs to be performed for different values of the time index 'i' across a UI. As a result, the total computation time further scales by the number of locations "i" across the UI. There can be 100 or more such calculations for different values of 'i' to render a smooth and statistically-significant eye diagram, although the exact number used can vary in accordance with designer preferences or in accordance with the desired resolution needed to arrive at statistically-significant BERs. In any event, the point here is that the computation involved in SSA techniques can require significant computing resources. Thus, like traditional techniques, SSA techniques can also be limited by the processing speed and memory in the designer's computer system.

The inventors have discovered methods for improving the speed and memory efficiency of SSA techniques involving recursive convolution, and such details are discussed herein.

BRIEF DESCRIPTION OF THE DRAWINGS

FIG. 1 illustrates a block diagram of a transmission system having a channel.

FIG. 2 illustrates the effect of a channel on an ideal positive pulse transmitted across the channel.

FIG. 6 illustrates pseudo-code for one embodiment of the disclosed recursive summation algorithm.

FIGS. 7A-7C and 8 illustrate step-by-step operation of the recursive summation algorithm of FIG. 6, including population of relevant vectors.

FIGS. 13A and 13B illustrate other embodiments of the recursive summation algorithm particularly useful in a computer system having parallel processing capability.

DETAILED DESCRIPTION

A computer-implementable recursive summation algorithm is disclosed that is useful for efficiently performing recursive convolution, such as is often required in Statistical Signal Analysis (SSA) techniques. As noted in the Background, recursive convolution can be computationally difficult. Consider the vector Xi in FIG. 4A, which vector may comprise the positive pulse response from Casper's technique as described earlier. This simple example vector contains four terms $[X(i)_0, X(i)_1, X(i)_2, X(i)_3]$ each taken at a particular time 'i' in a unit interval.

Figure 4A:
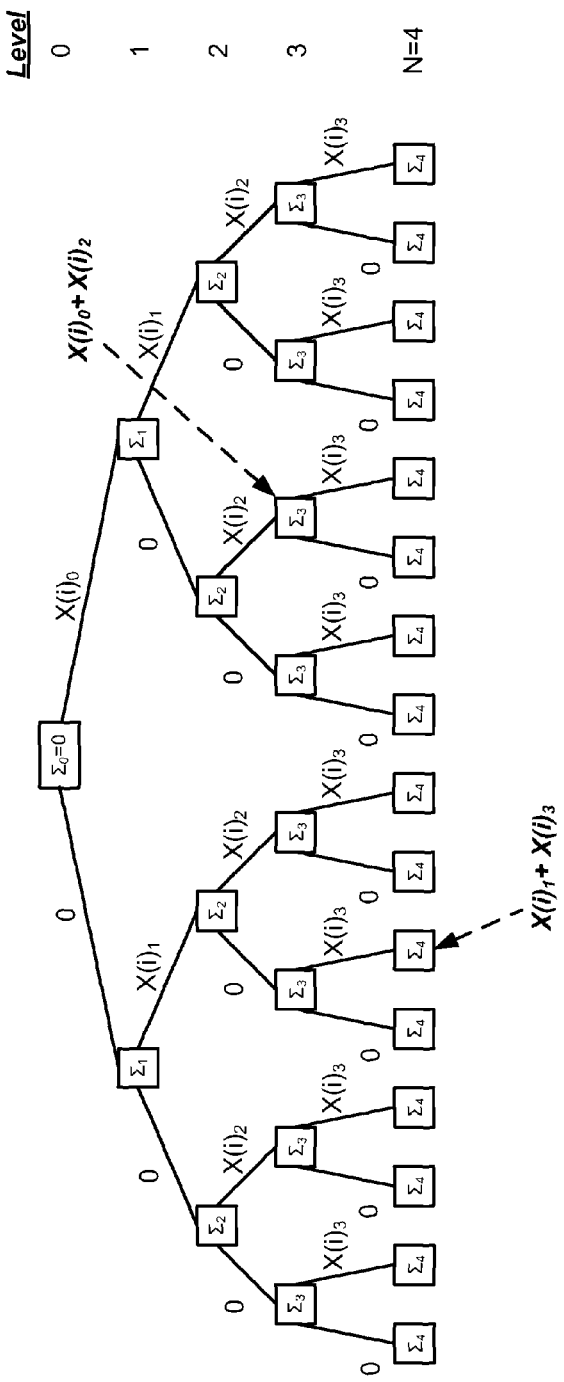
FIGS. 4A-4B and 5 illustrate a tree structure useful in introducing the mathematics underlying the disclosed recursive summation algorithm.

To form a Probability Distribution Function (PDF) at time 'i' indicative of the spread these four terms provide, each value is paired with a zero delta function (X(i), 0), and each is recursively convolved with all the others. The mathematics of how this can occur were discussed in the Background, but FIG. 4A provides another way of viewing the mathematics having relevance to the recursive summation algorithm to be discussed shortly. As shown, the mathematics can be visualized as a tree structure. At a first level 0 of the tree, we see a split between the first term $X(i)_0$ of the vector and its zero pair. At a next level 1, the zero value on the left is split between the second term $X(i)_1$ and its zero pair, and the $X(i)_0$ value on the right is similarly split between the second term $X(i)_1$ and its zero pair. This branching continues at levels 2 and 3 with respect to remaining values $X(i)_2$ and $X(i)_3$ from the vector. At each level, a sum can be calculated indicative of the sum of all paths to that level in the tree.

FIG. 4B again shows this tree structure as populated for a particular example vector of $[X(i)_0=4, X(i)_1=3, X(i)_2=2,$ and $X(i)_3=1]$. The sums at the lowest level 4 provide the raw output data, which raw data is not yet binned into a histogram that comprises the PDF (shown at the bottom). As can be seen, 16 raw data values result, or $2^N$ where N equals the number of values in the vector (4 in this example). Because some of the raw data values are the same (e.g., 3, 4, 5, 6, 7), those values when binned to arrive at the PDF will be represented by larger-magnitude delta functions. Of course, the actual magnitudes of the delta functions would be normalized in the PDF so that the sum total of all magnitudes is 1, or 50% of the PDF represents reception of only one logic state.

Figure 3A:
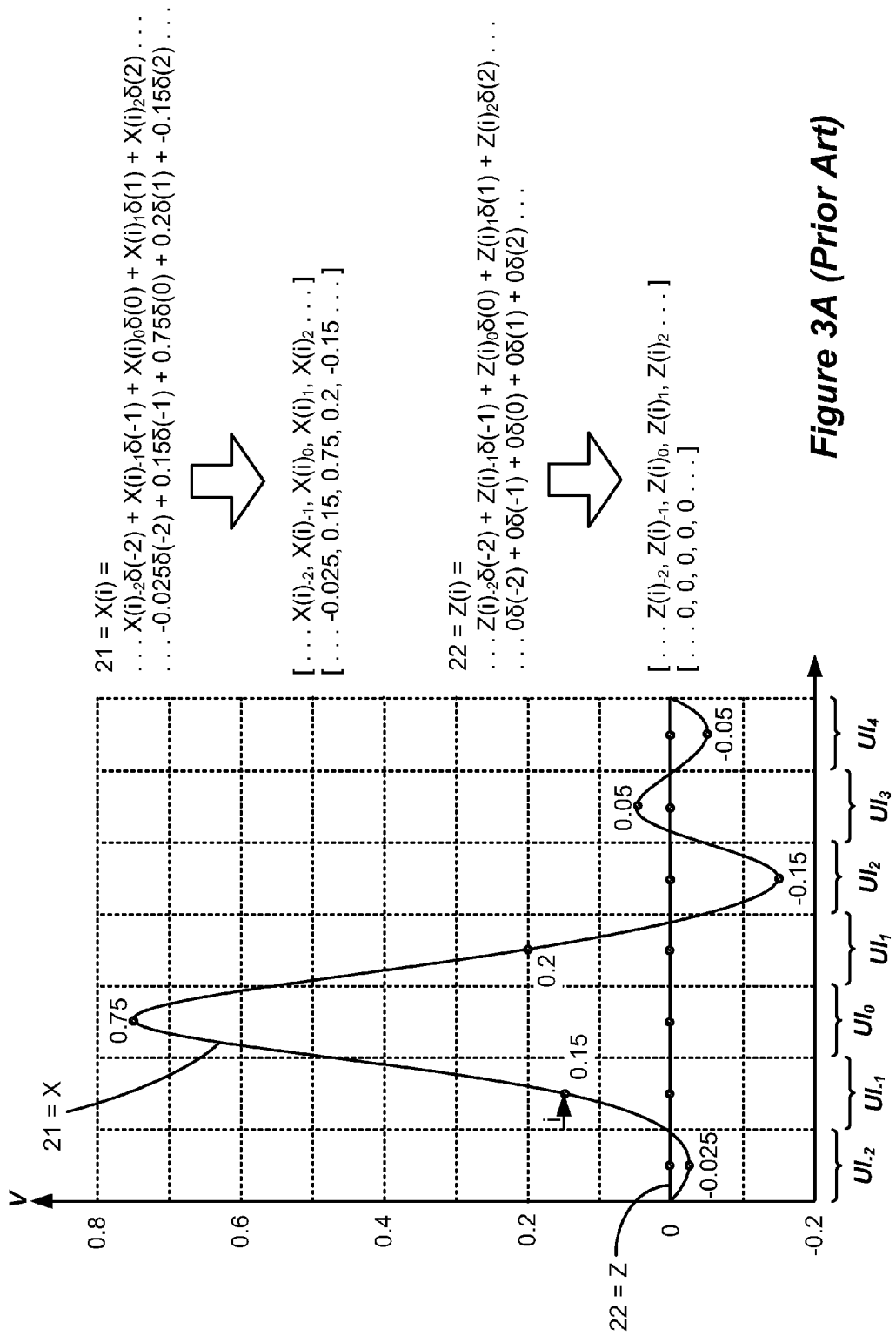
FIGS. 3A-3E illustrate a prior art technique for generating a probability distribution function (PDF) indicative of the statistics of reception of logic '0's and '1's at a receiver at the end of the channel.
Figure 3B:
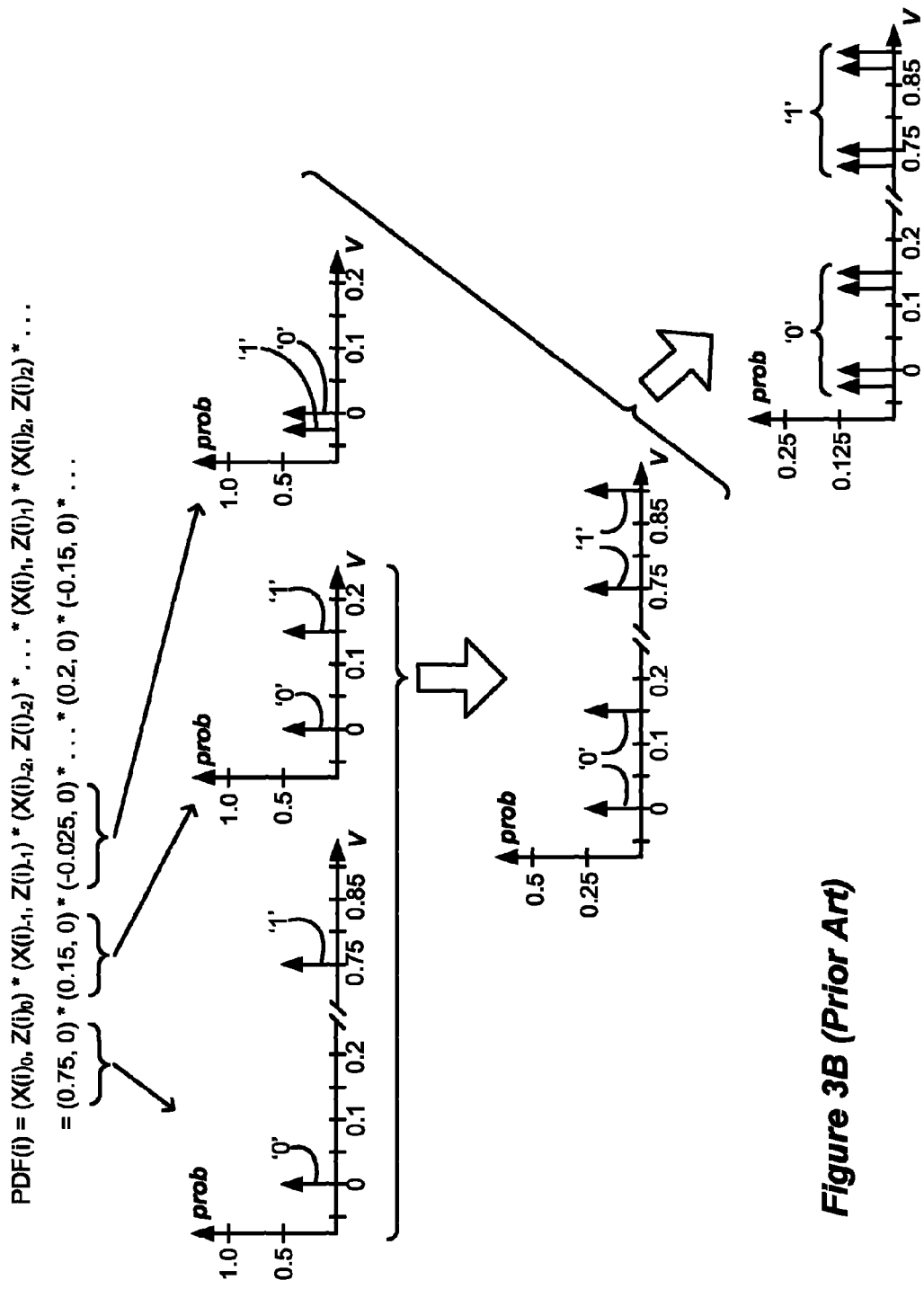
Figure 3C:
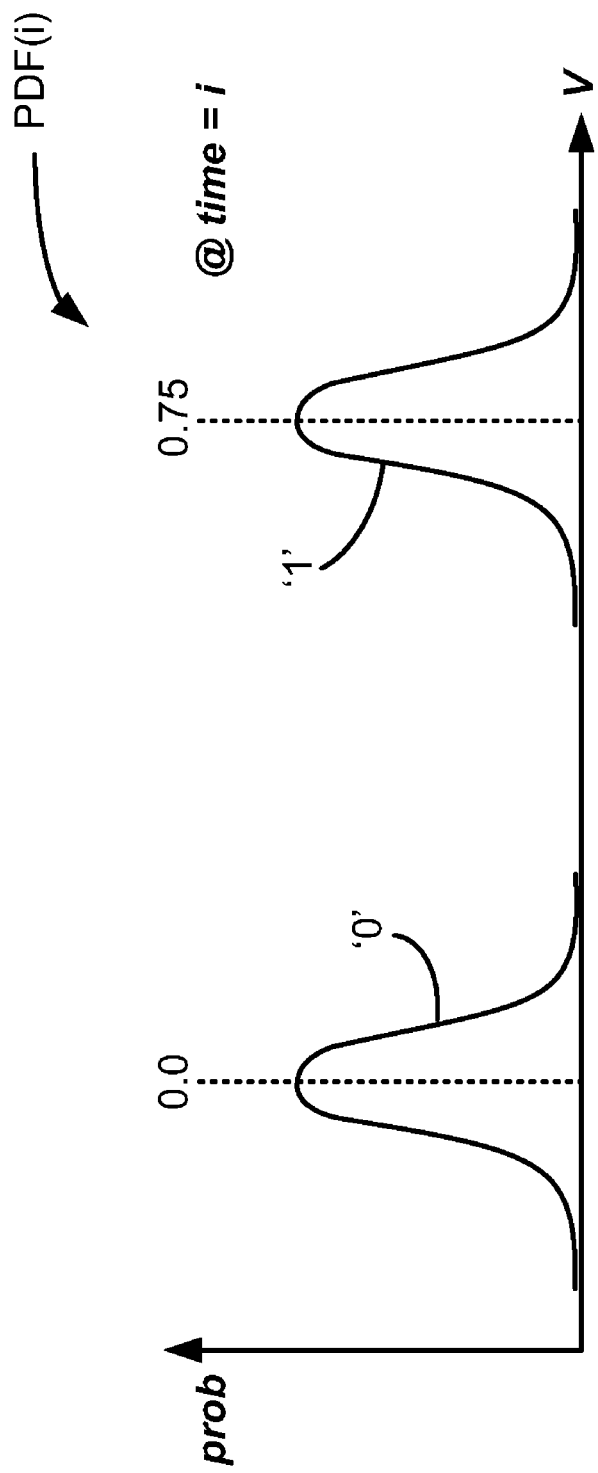
Figures 3D, 3E:
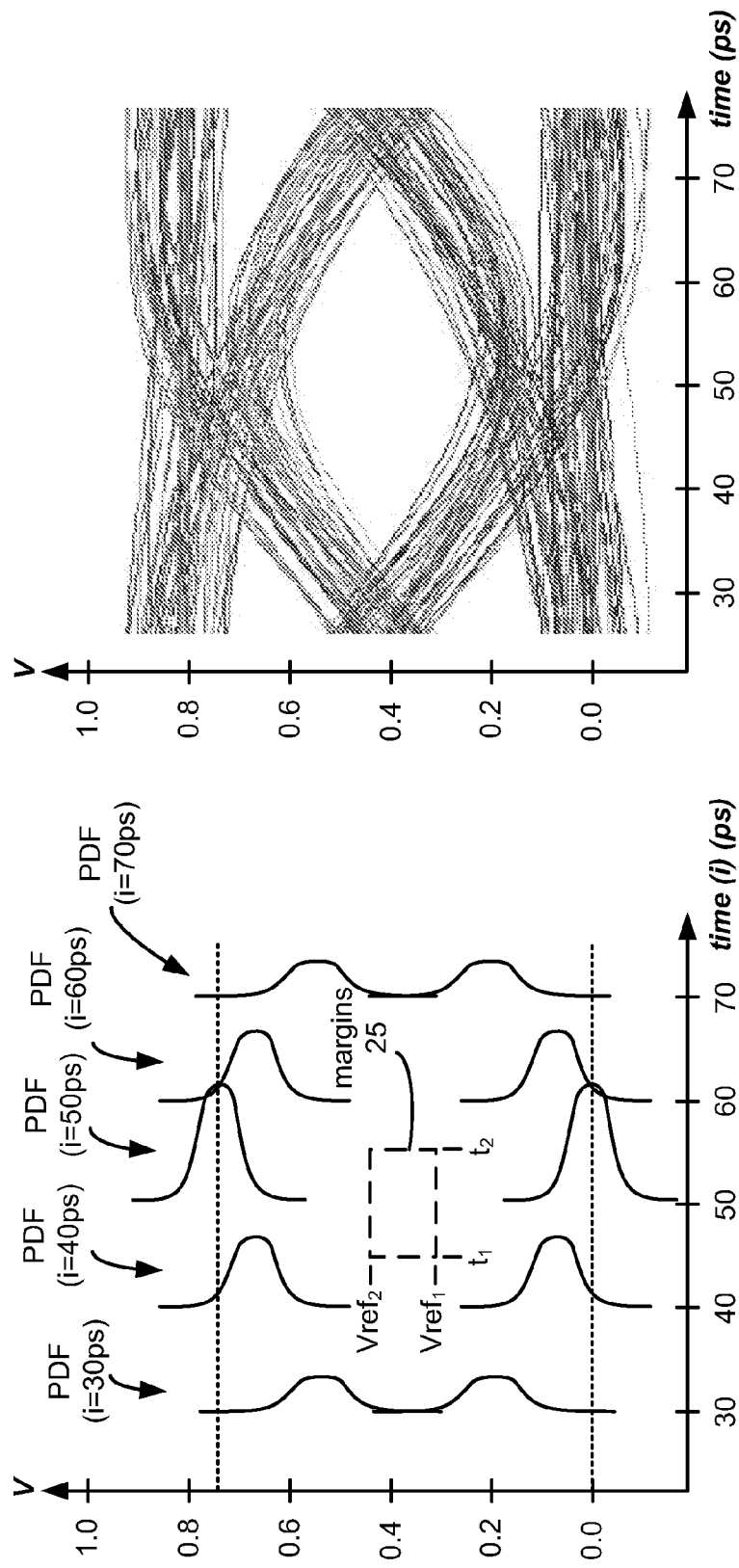
Figure 4B:
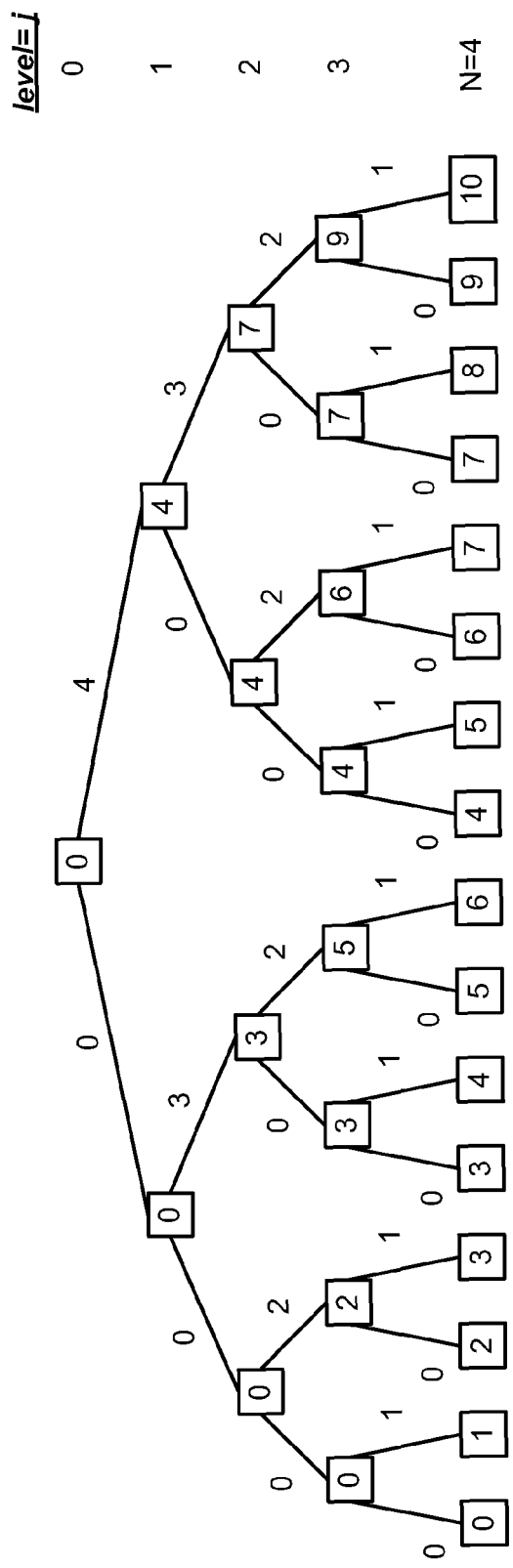
Figure 4B:
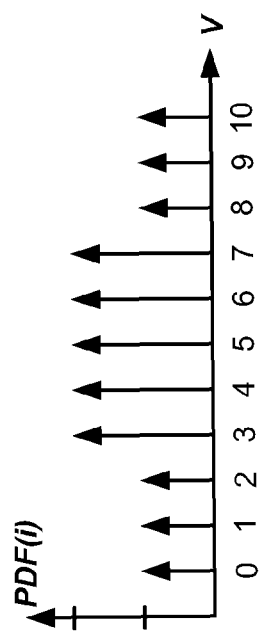

FIG. 5 once again shows the example tree of FIG. 4B, but with additional structures meant to introduce the operation of the disclosed recursive summation algorithm. Three memory structures are shown: 'Vec,' 'Sum' and 'Out.' 'Vec' comprises the input vector to the algorithm, and in the example shown comprises four values $[X(i)_0, X(i)_1, X(i)_2, X(i)_3]$, for a length of N=4. Of course, N is variable in length, and will generally be selected after preliminary pulse response evaluation. When used to process simulation results such as the positive pulse response from Casper's technique, 'Vec' would preferably be long enough to pick up significant ISI or other perturbation artifacts. For example, and referring again briefly to FIG. 3A, 'Vec' would preferably have at least N=7 terms (from $UI_{-2}$ to $UI_4$) because the positive pulse response shows significant ISI effects in these UIs. Moreover, in some cases, perturbations might occur far removed from the main cursor due to long-term signal reflections, in which case vectors X(i) and Z(i) can include such far-removed UIs without accounting for every UI in between. For example, if the behavior captured in FIG. 3A also experiences a disturbance at $UI_{15}$ (not shown), it would not be strictly necessary to increase the number of terms N to 15. Rather, the number of terms N could simply be increased to 8 (to include only terms $UI_{-2}$ to $UI_4$ and $UI_{15}$), because once the relevant samples are identified for use in the technique, the actual relative location within the bit stream is no longer relevant. In other words, the unit intervals included in the response for analysis do not need to be consecutive.

The 'Sum' vector holds the current summation value at various levels of the tree, and comprises N+1 or 5 values ($Sum_0$-$Sum_4$). 'Sum' will take on 2N different values through the operation of the algorithm, many of which will be duplicate values. The 'Sum' vector is intermediate in that it holds various sums during the operation of the algorithm. 'Out' comprises the outputs of the sums at the lowest level N=4 of the tree, i.e., the raw output data as discussed above. Because these values are representative of voltages in the simulation environment in question, the values are denoted as $V_x(i)$. As noted, there are $2^N$ such values.

Even prior to understanding the operation of the recursive summation algorithm, it can be appreciated that the amount of memory required to run the algorithm for a given input vector 'Vec' of length N can generally be known in advance. This allows the designer prior to starting a simulation to verify if the computer system in which the simulation will take place will have sufficient memory. Alternatively, it allows the designer to tailor the length N of 'Vec' to fit the available memory in the computer system. Of course, some amount of "scratch pad" memory will also be required to temporarily hold calculations and other relevant data processing information while running the disclosed recursive summation algorithm. However, because such scratch memory will be constantly overwritten during the operation of the algorithm, the memory needed for the output ('Out') is much more significant, especially when considering the length of such vectors, and the fact that such vectors must be considered for many values of 'i' across the unit interval. As noted in the Background, 'i' is typically greater than 100.

Figure 5:
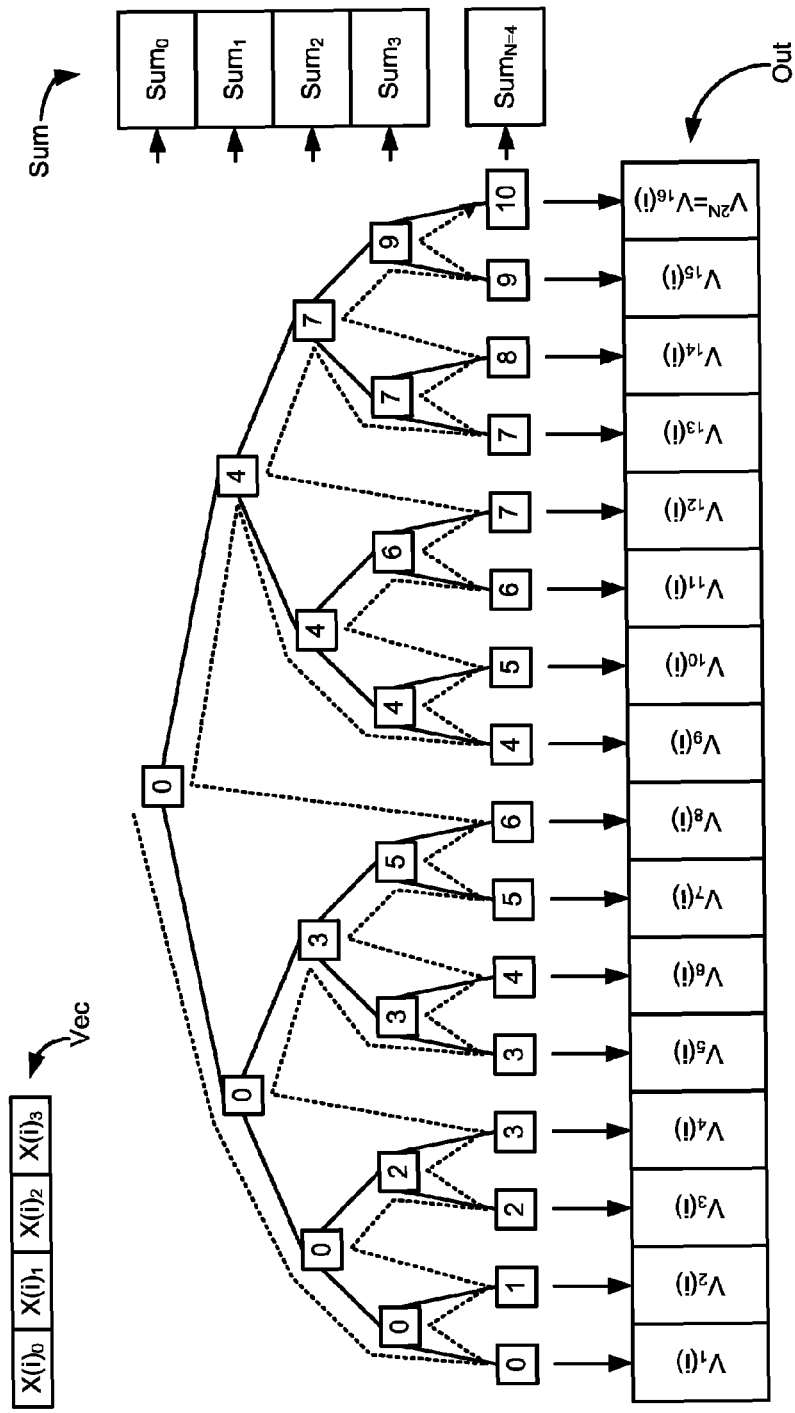

Also shown in FIG. 5 is a dotted-lined arrow that illustrates generally the flow with which the disclosed recursive summation algorithm operates to populate the relevant values for 'Sum' and 'Out' in the tree. This flow will be better appreciated upon review of the operation of the recursive summation algorithm, to which we now turn.

FIG. 6 shows pseudo-code for the recursive summation algorithm 'Recsum.' As just discussed, the algorithm operates with one input vector 'Vec,' one intermediate vector 'Sum,' and one output vector 'Out.' As discussed above, the size of 'Sum' (N+1) and 'Out' ($2^N$) can be set and allocated in the computer system once the length of 'Vec' (N) is known. After input or definition of these vectors, 'Recsum' can be called to begin the recursive summation algorithm. As evidenced by the parenthetical values accompanying 'Recsum', the algorithm requires two arguments: 'j,' which indicates the level at which the algorithm is currently operating; and '$Sum_j$,' which comprises the sum of the paths to level 'j' at that point in time of the algorithm's operation. The computer code used in an actual implementation of the recursive summation algorithm would vary depending on the particulars of the computer system in which the algorithm is run, but such coding would be a routine undertaking for one skilled in the art given the benefit of this disclosure.

Level argument T is important, because as can be seen, the 'Recsum' algorithm is recursive in that it calls itself, incrementing T as it does so. Specifically, 'Recsum' first asks if T is greater than or equal to N, the length of 'Vec'. If so, it inputs the current value of '$Sum_j$' to the next empty register in output vector 'Out' (i.e., "append $Sum_j$ to Out"). Returning briefly to FIG. 5, this step in the algorithm is represented by populating the value of the $Sum_j$ at the lowest level in the tree into the various voltages V(i) in the 'Out' vector. If j is not greater than or equal to N, 'Recsum' calls itself twice. On the first call, it passes $Sum_j$ and increments argument 'j' by 1 ("Recsum ($Sum_j$, j+1)"), which is analogous to populating the left branches at each of the Sum point in the tree. On the second call, it passes $Sum_j$ plus the current corresponding value in 'Vec' ($X(i)_j$) and again increments argument 'j' by 1 ("Recsum ($Sum_{j+1}$+$X(i)_j$, j+1)"), which is analogous to populating the right branches at each of the Sum points in the tree.

Figure 7B:
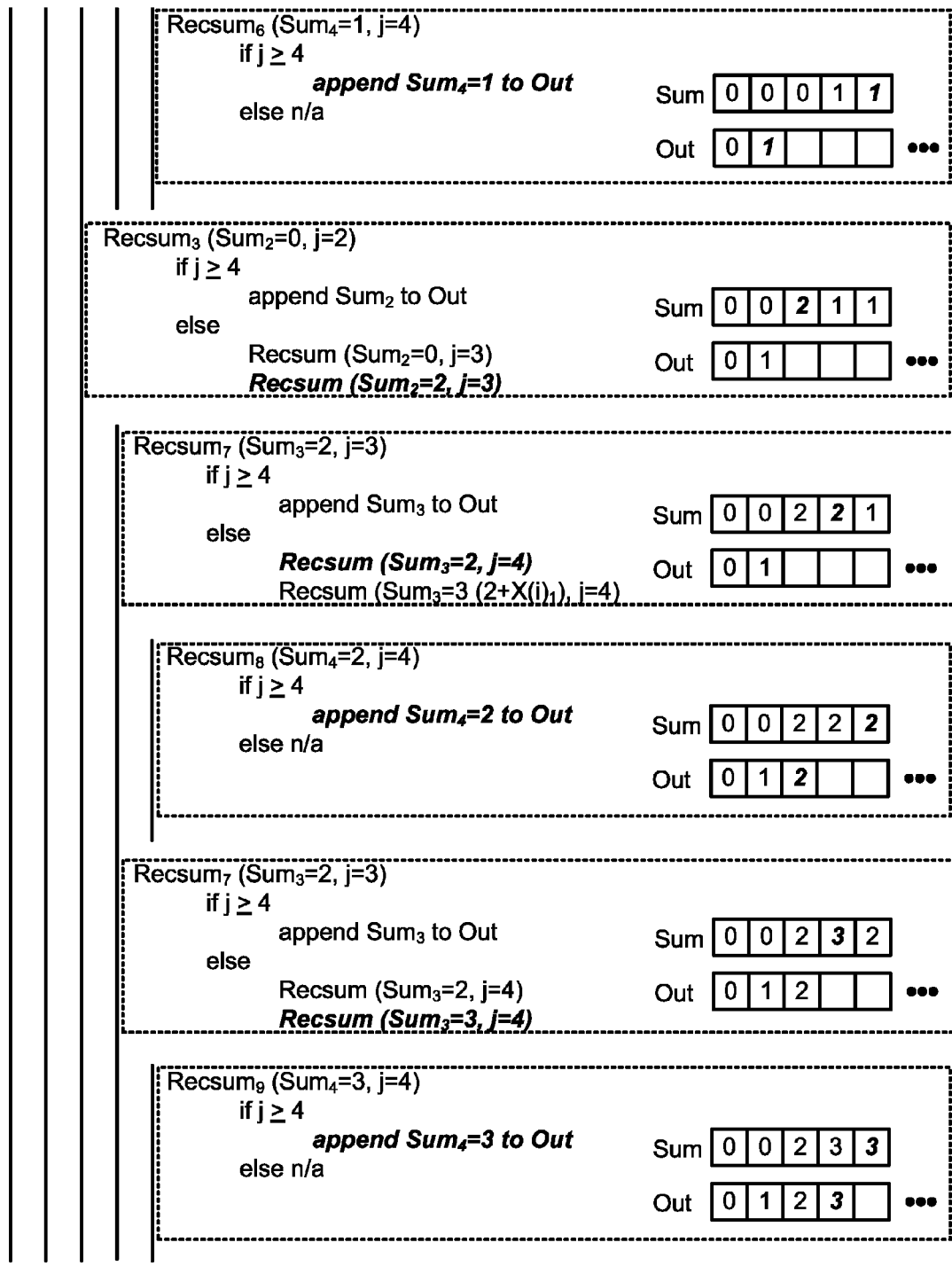

FIGS. 7A and 7C illustrate operation of 'Recsum' for the example input vector 'Vec'=[4, 3, 2, 1,] discussed earlier. Due to the recursive nature of 'Recsum,' it is typically called many times during its operation, and in the example shown N+1 Recsum calls can be pending at any given time. Each new call to "Recsum" is labeled with a new subscript in FIGS. 7A-7C, which should assist in understanding when the algorithm has returned to a previous 'Recsum' call. Portions of the Recsum algorithm and the memory structures 'Sum' and 'Out' that are implicated at various steps in the process are bolded and italicized for easier viewing.

The first 'Recsum' call ('$Recsum_1$') starts with $Sum_0$=0 and j=0. Because j is less than 4 (N), Recsum is again called ('$Recsum_2$') with the current sum and j=1 passed as arguments. $Sum_1$=0 is stored in 'Sum'. Because j=1 is still less than 4, Recsum is again called ('$Recsum_3$') and the process repeats (j is incremented, $Sum_j$ is populated, etc.) until in call 5 ('Recsum5'), j is now equal to 4. The current sum ($Sum_4$=0) is thus appended to 'Out,' and the call to $Recsum_5$ is now finished.

Because the now-completed $Recsum_5$ was called from $Recsum_4$, the process returns back to $Recsum_4$, where $Sum_3$=0 and j=3. At this point, the second Recsum call in $Recsum_4$ is implicated, as shown at the bottom of FIG. 7A. $Sum_3$ is now updated with the sum of the previous value for $Sum_3$ (0) and value $X(i)_3$ (1) from 'Vec,' and a new call $Recsum_6$ is made with this new value for $Sum_3$=1 and j incremented to 4, as shown at the top of FIG. 7B. Because j once again equals 4 in $Recsum_6$, the current sum ($Sum_4$=1) is thus appended to 'Out,' and the call to $Recsum_6$ is now finished.

Because the now-completed $Recsum_6$ was (like $Recsum_5$) called from $Recsum_4$, the process returns back to $Recsum_4$, which is now complete. Because the now-completed $Recsum_4$ was called from $Recsum_3$, the process returns back to $Recsum_3$, where $Sum_3$=0 and j=2. At this point, the second Recsum call in $Recsum_3$ is implicated: $Sum_2$ is now updated with the sum of the previous value for $Sum_2$ (0) and value $X(i)_2$ (2) from 'Vec,' and a new call $Recsum_7$ is made with this new value for $Sum_3$=2 and j incremented to 3. Because j=3 is less than 4, Recsum is called again ('$Recsum_8$'). Now j equals 4, and the current sum ($Sum_4=2$) is thus appended to 'Out,' and the call to $Recsum_8$ is now finished, etc. The steps as described to this point are summarized in FIG. 8. Some subsequent steps are included in the remainder of FIG. 7B and in FIG. 7C, but how these subsequent steps operate to update 'Sum' and to populate 'Out' should be clear from the preceding discussion and are therefore not further discussed.

Figure 8:
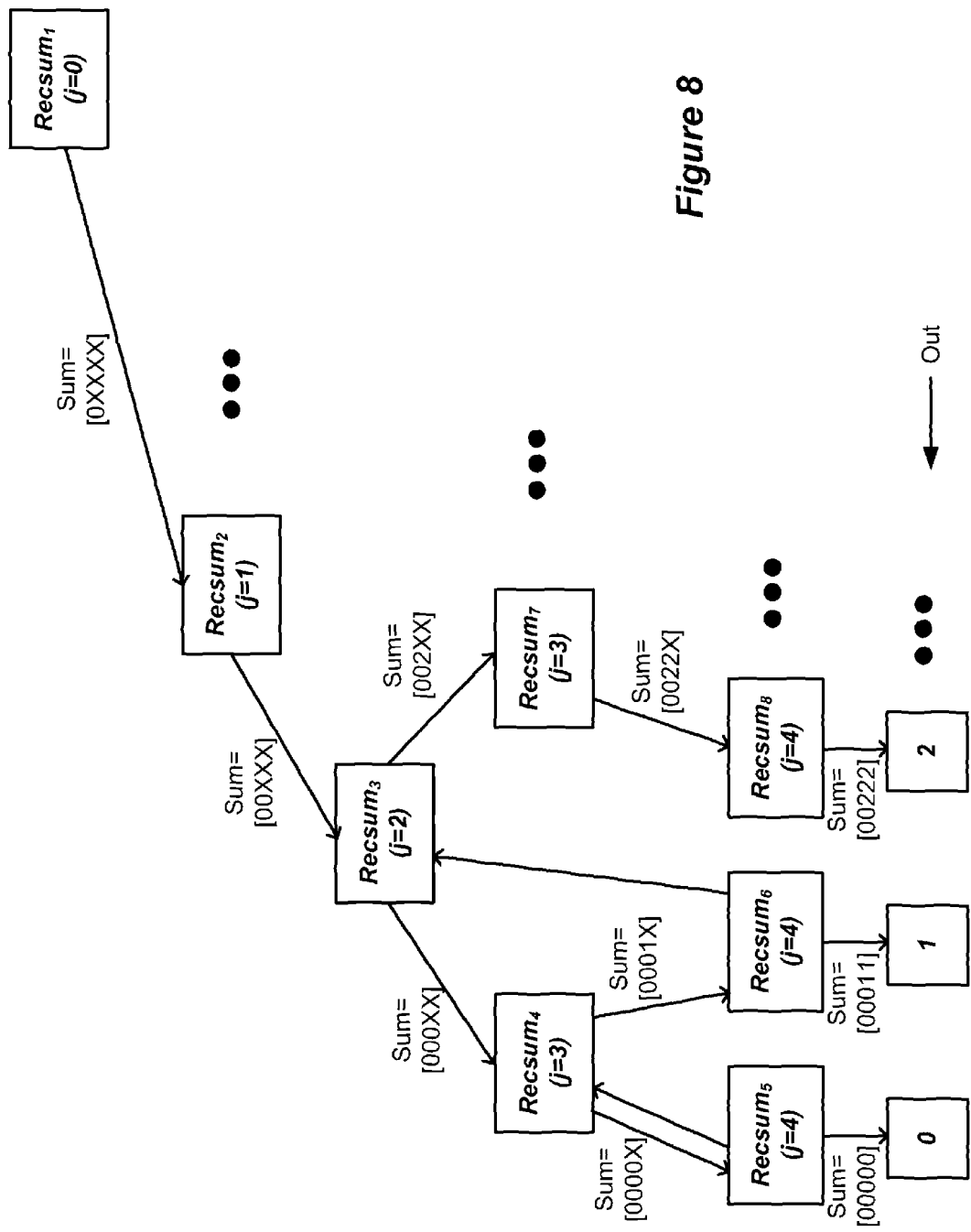

Notice from FIG. 8 that Sum values with an index greater than the current value for argument 'j' are irrelevant, and may be considered as "don't care" values ('X'). That is, $Sum_{j>q}=X$ when j=q. This is because it is important to the algorithm to only keep track of higher-order sums during operation of the algorithm, because such higher order sums are used when a return is made to a previously-called Recsum. For example, when returning to $Recsum_4$ from $Recsum_5$, $Sum_4$ is irrelevant because it is eventually overwritten once $Recsum_6$ is performed. Such "don't care" values were not indicated in FIGS. 7A-7C, and instead such irrelevant lower-order values in the 'Sum' vector were allowed to remain until they were overwritten.

Figure 9:
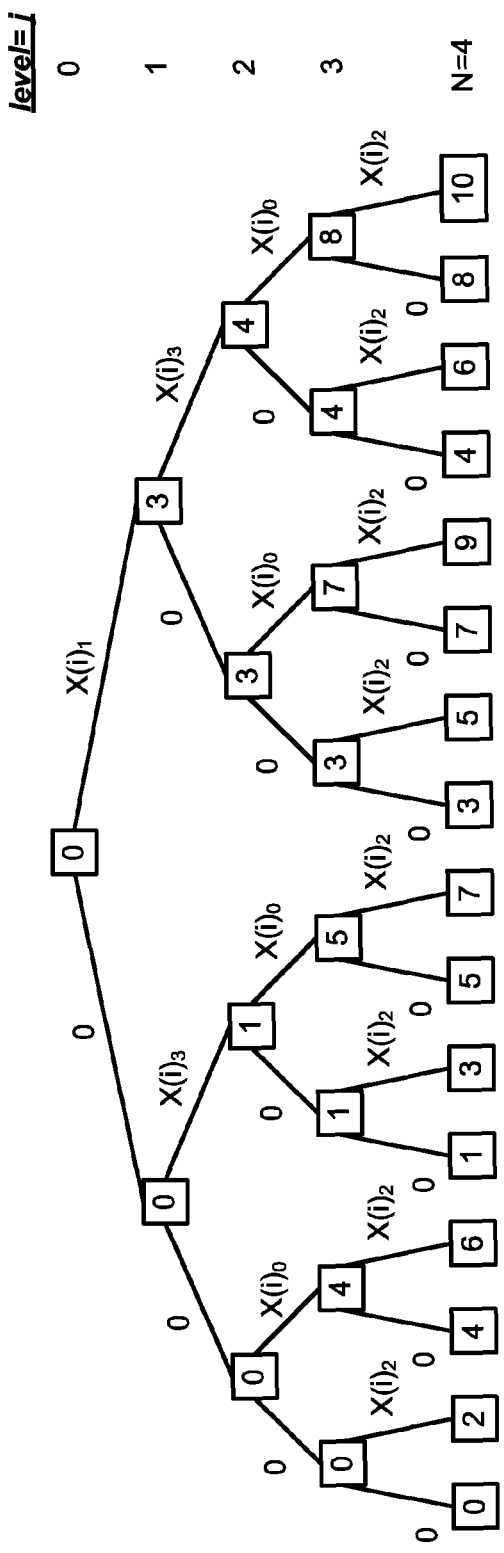
FIG. 9 illustrates the commutative nature of the disclosed recursive summation algorithm.
Figure 9:
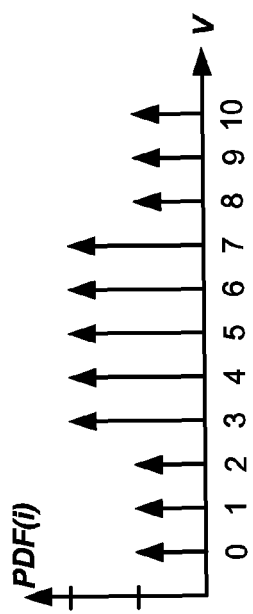

FIG. 9 illustrates the commutative nature of the disclosed recursive summation algorithm, and proves that it is not important in what order the terms from the input vector, 'Vec,' are taken up during analysis. FIG. 9 is essentially similar to the tree structure shown in FIG. 4B, but in this case the terms are not taken up in the order in which they are presented in 'Vec' (i.e., $X(i)_0$, $X(i)_1$, $X(i)_2$, etc.). Instead, $X(i)_1$ is chosen at the top level of the tree; $X(i)_3$ at the next level; $X(i)_0$ at the next level; and $X(i)_2$ at the bottom. The resulting PDF as shown at the bottom is the same as that illustrated in FIG. 4B, despite the change in the ordering. This illustrates that the order of the terms in 'Vec' is arbitrary. Thus, while the Recsum algorithm has been illustrated for simplicity as including a next term in 'Vec' as the analysis progresses (i.e., Recsum ($Sum_j+X(i)_j$, j+1), this next term $X(i)_j$ need not necessarily be the very next term in 'Vec' as that input vector is currently (and arbitrarily) structured. Thus, manipulation of the 'Sum' argument by a new term (Sumj+X(i) j) in the Recsum algorithm should not be interpreted as necessarily incorporating a next term in 'Vec,' but instead should be interpreted as choosing a new term from 'Vec' that has not yet been referenced in higher-ordered Recsum calls.

Figures 10, 11:
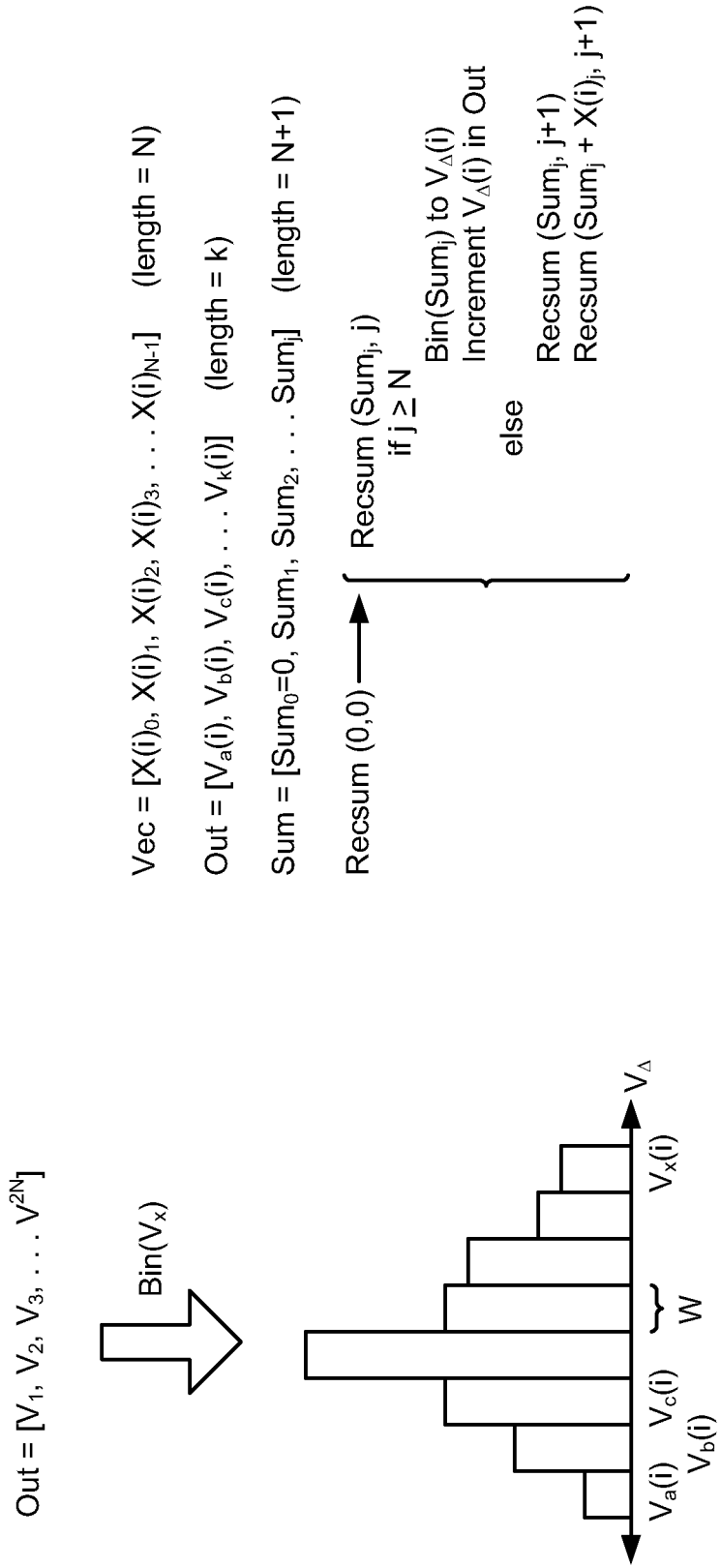
FIG. 10 illustrates how the output of the recursive summation algorithm can be binned to provide a PDF useful for Statistical Signal Analysis (SSA).
FIG. 11 illustrates another embodiment of pseudo-code for the recursive summation algorithm which includes in-situ binning.

Once the recursive summation algorithm has completed, and raw output data (V(i)) has been populated in the 'Out' vector, it is then useful to bin the values to form a histogram on the way to forming a PDF, as shown in FIG. 10. In this regard, remember that the raw output data in 'Out' represent voltages having a particular resolution, for example 1 mV. However, the voltage width W of the bins $V_A$ in the histogram may be different (e.g., W=10 mV), thus providing a different resolution in the resulting PDF. In any event, binning the raw output data V(i) to a particular voltage range bin $V_A(i)$ is a simple and standard procedure in typical computer systems in which one might perform the disclosed algorithm. For example, Matlab™ provides a binning function for forming histograms which allows a designer to specify bin width, W. Once the histogram is formed, it can then be normalized, and perhaps smoothed by curve fitting, to form the desired PDF(i) (not shown in FIG. 10). It is useful to remember that the resulting PDF(i) represents a single time 'i' within a unit interval. It will be necessary to use the disclosed algorithm again to produce many such PDFs to create an eye diagram of sufficient depth to assess channel reliability and to allow sensing margins to be set, particularly in light of ultra-low Bit Error Ratio targets.

FIG. 11 provides alternative pseudo-code for the recursive summation algorithm which includes in-situ binning. The algorithm is largely the same, although in this instance the length of the output vector 'Out' is not set on the basis of the length of the input vector 'Vec' (N), but is instead set on the desired number and width of bins, $V_A(i)$. For example, if it is useful to assess voltages in a 0.5V range with a resolution of 10 mV, then 'Out' would have a length 'k'=50, which comprises the range divided by the resolution (0.5V/0.01V). Within the algorithm, relevant summed data $Sum_j$ is not merely appended to 'Out', but is first assigned to a particular bin $V_A(i)$. Again, this step can be performed using any binning algorithm. Once the relevant bin is determined, the value for that bin is incremented in 'Out,' and thus 'Out' essentially records a count of the number of times each bin is implicated.

Figure 12:
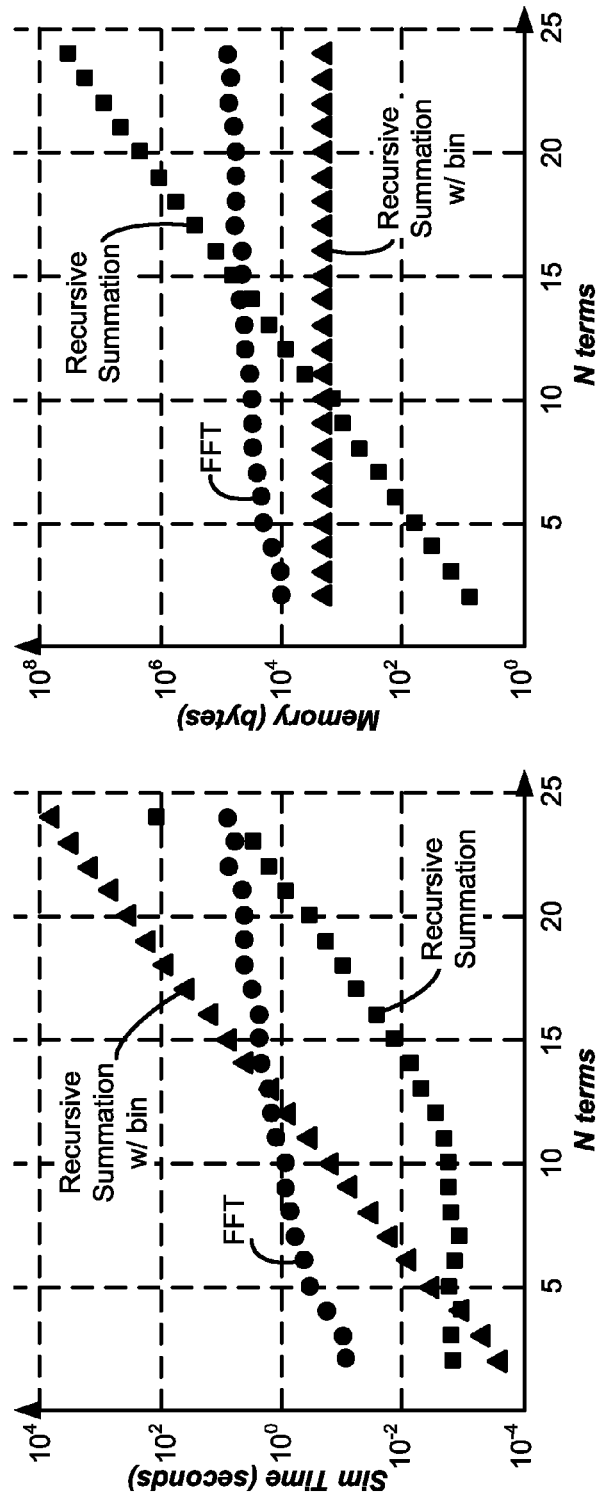
FIG. 12 illustrates simulation to compare the speed and memory requirements for recursive convolution performed using an FFT algorithm, the disclosed recursive summation algorithm, and the disclosed recursive summation algorithm with in-situ binning.

FIG. 12 illustrates simulations to compare the speed and memory requirements for recursive convolution performed using an FFT algorithm as discussed in the Background, the disclosed recursive summation algorithm (e.g., FIG. 6), and the disclosed recursive summation algorithm with in-situ binning (e.g., FIG. 11). Simulations were varied for a differing number of terms N in the input vector, 'Vec,' and was performed using Matlab™ 2009b on a standard workstation (running 32-bit Windows XP with a 2.79 Ghz CPU). As can be seen, the disclosed recursive summation algorithm, both with and without binning, provides superior speed and lower memory requirements than the prior art FFT algorithm, particularly when the input vector contains fewer terms. This is significant, because well-behaved, usable channels will generally not produce pulse responses that extend beyond 10-15 UIs. In many applications, the number of required terms will be closer to 5 or 6.

It should be noted that the simulations in FIG. 12 comprise computations at one particular time 'i.' As noted earlier, a realistic simulation might require 100 or more such computations to generate a statistically-significant eye diagram. Any benefits to speed or memory achieved through use of the disclosed recursive summation techniques are therefore multiplied to that extent, and can result in time/memory savings of many orders of magnitude when producing such eye diagrams.

As would be expected, and as shown in the left graph, summation without binning occurs more quickly than recursive summation having in-situ binning, due to the additional processing that in-situ binning requires. However, as shown in the right graph, recursive summation with in-situ binning requires an amount of memory that is essentially independent of the number of input terms N. This is because, as mentioned earlier, the length of output vector 'Out' is independent of N when in-situ binning is used. By contrast, when recursive summation without binning is used, 'Out' scales as $2^N$, and hence requires an exponentially-increasing amount of memory. This suggests that whether binning is indicated for a given implementation may depend on the resources of the computer system in which the recursive summation algorithm is operating: if the system is slow but has unlimited memory, recursive summation without binning may be preferred; if the system has limited memory but simulation time is not a concern, recursive summation with binning might be preferred. It should be noted that the simulations in FIG. 12 are merely meant to illustrate general trending with respect to the different illustrated techniques, and that actual results may vary depending on the particular implementations chosen for these techniques. For example, if a more-efficient binning algorithm is used, the simulation time of recursive summation with in-situ binning would generally decrease.

Figure 13A:
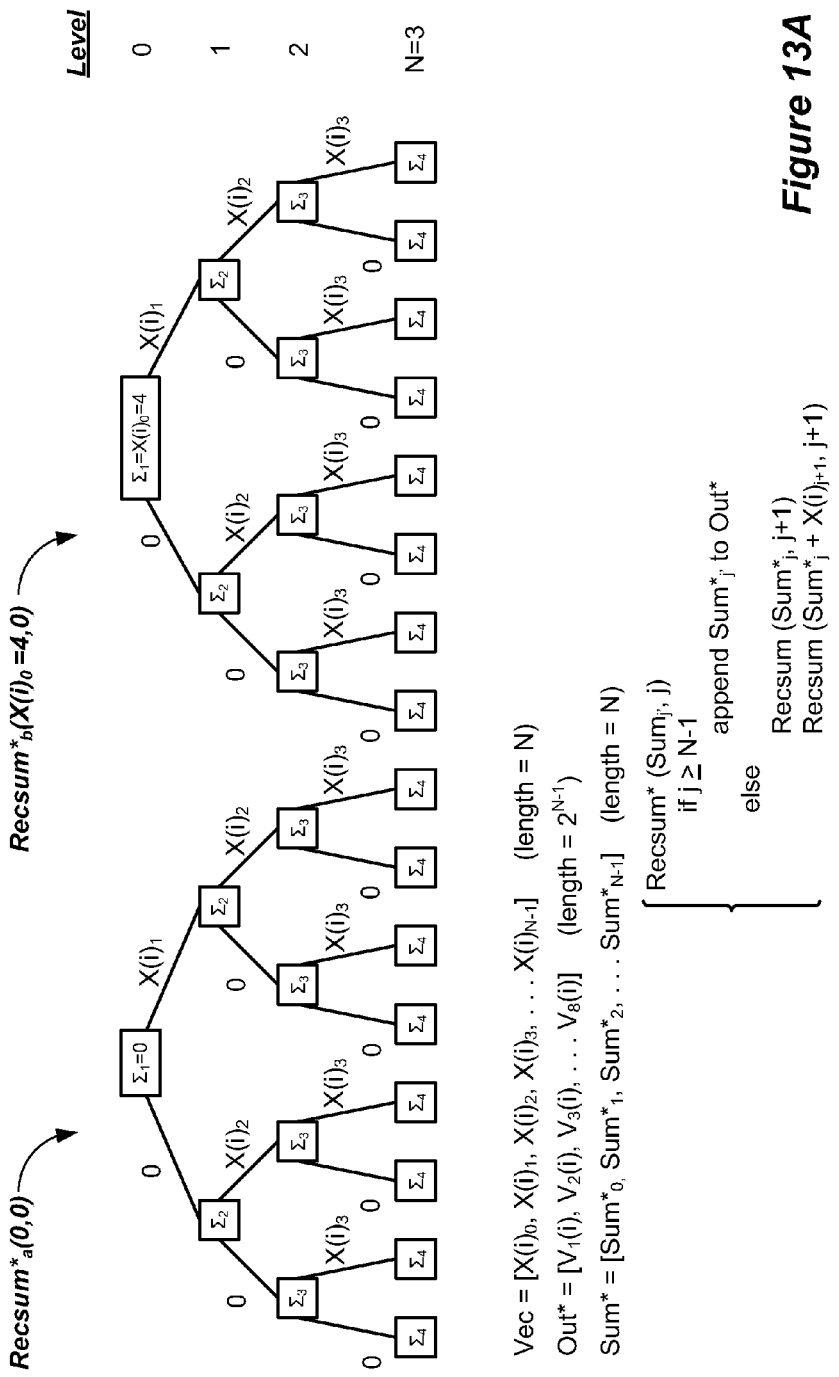

FIG. 13A illustrates another embodiment of the recursive summation algorithm which is particularly useful when implemented in computer system having parallel processing capability. In this example, recursive convolution is performed using two Recsum algorithms 'Recsum*$_a$,' and 'Recsum*$_b$,' and as can be seen from FIG. 13A, amounts to removing the top level of the analysis (compare with FIG. 4A). To compensate for the removal of this level, some adjustments are made to the algorithm. For example, in 'Recsum*$_b$,' the initial Sum*$_j$ argument is not 0 as in the earlier example, but X(i)$_0$, the first element of the input vector 'Vec.' As shown in the pseudo-code for the algorithm, the "if" clause has been changed to compare j to N−1, or 3, meaning that output vector 'Out*' will be written to once T reaches this value. In another difference, note in the "else" clause that the second Recsum* call now adds to the current Sum*$_j$ the next-indexed element in the input vector, X(i)$_{j+1}$. As a result of these changes, the length of 'Sum*' is decreased by 1 (to N) and the length of 'Out*' is decreased by a power of 2 (to $2^{N-1}$), although it should be remember that in this implementation there would be two such vectors for each: "Sum*$_a$,' 'Sum*$_b$,' 'Out*$_a$,' and 'Out*$_b$.' Aside from these changes, the Recsum algorithm essentially operates as before, with each Recsum populating 'Out*$_a$' and 'Out*$_b$,' which two output vectors can be concatenated to create a vector equivalent to 'Out' as discussed earlier. In a preferred implementation, 'Recsum*$_a$' and 'Recsum*$_b$,' would be run in parallel, although this is not strictly necessary. Such parallel processing is eased in computer system environments having dual or multiple processors.

FIG. 13B illustrates application of the recursive summation technique when even further parallel processing is used. In this example, the analysis is broken down into the operation of four Rescum algorithms, which amounts to removing the two top levels of the analysis. This further shortens the 'Out*' vector produced by each algorithm (down to $2^{N-2}$, or 4 in the example shown), and further shortens the 'Sum' produced by each algorithm to a length of N−1. Again, the resulting 'Out*' vectors can be concatenated to produce a final PDF result. The pseudo-code of Recsum* has also been changed accordingly (j≧N−2; Sum*j=X(i)$_{j+2}$, etc.) to account for the removal of two levels. As in FIG. 13A, the initial Sum*$_j$ argument is changed, and comprises all possible summed combinations of the first two terms in the input vector, 'Vec' (i.e., 0, X(i)$_0$, X(i)$_1$, and X(i)$_0$+X(i)$_1$). Again, due to the commutative nature of the recursive summation algorithm as discussed with reference to FIG. 9, these initial Sum*$_j$ arguments can be formed from any two terms in the input vector, although X(i)$_0$ and X(i)$_1$ are shown for convenience. Given this description, it should be apparent that even further levels of parallelism can be achieved (×8, ×16, etc.) by making appropriate adjustments to the indices used in the Recsum algorithm, and by changing the initial Sum*$_j$ values to reflect the different summed value combinations. What degree of parallelism would be most appropriate or efficient would depend on computer system speed, the amount of memory, the extent of parallel processing capability, etc.

Because the Recsum computation time scales as $2^N$ when no in-situ binning is used, dividing down the number of terms through parallelism actually reduces the computation time by a factor of D, where D is the number of divisions or parallel operations. By the same token, parallelism can be used to accommodate a larger initial number of terms (N). Thus if a pulse response contains an abnormally high number of terms, parallelism can be used to calculate the recursive convolution in a more reasonable amount of time.

Although discussed with reference to Casper's technique for convenience, it should be understood that the disclosed recursive summation techniques can be used to benefit other techniques also involving recursive convolution, such as the techniques disclosed in U.S. patent application Ser. Nos. 12/838,144 and 12/838,120 incorporated earlier, or in other existing or future SSA techniques. Indeed, the disclosed recursive summation algorithms can be used in many environments where recursive convolution needs to be performed, even if not in the signal simulation arts.

Figure 14:
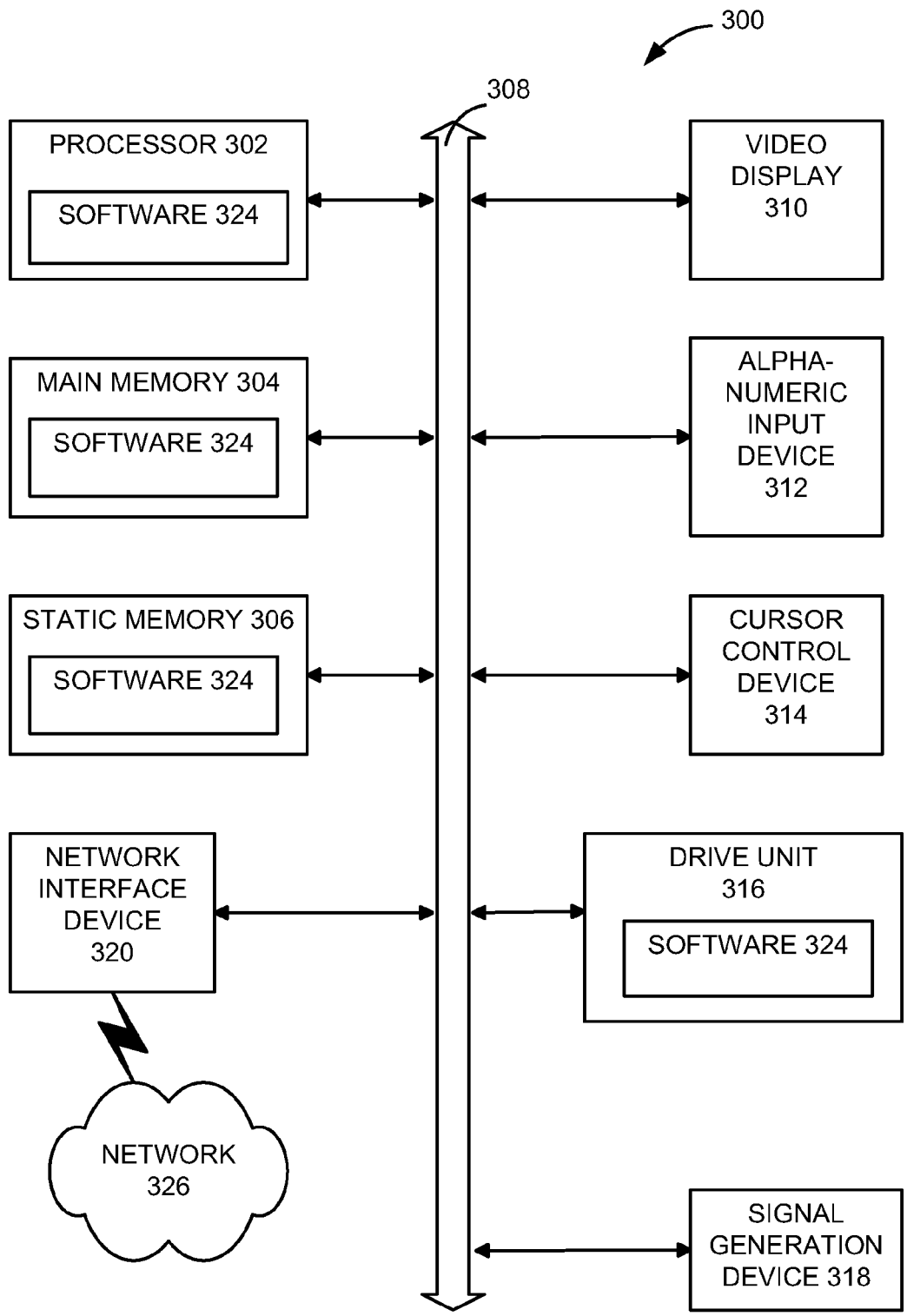
FIG. 14 illustrates an example computer system in which the disclosed technique may be operated.

One skilled in the art will realize that the disclosed recursive summation techniques are usefully implemented as software 324 running on a computer system, such as computer system 300 illustrated in FIG. 14. The technique can be encoded as software 324 on one or more computer readable media, such as a magnetic or optical disk, semiconductor memory, or other media known in the art or after-developed for holding software. Such a computer system can be broadly construed as any machine or system capable or useful in reading and executing instructions in the software and making the various computations the disclosed techniques require. Usually, embodiments of the disclosed techniques would be implemented as software installable on a circuit designer's workstation or work server. Moreover, embodiments of the disclosed techniques can easily be incorporated into pre-existing circuit simulation software packages. Different software packages or modules can be used to perform different aspects of the technique. For example, simulation—i.e., generation of the positive pulse response necessary to create the input vector 'Vec'—can occur using simulation software such as SPICE™, while remaining analysis—generation of the PDFs per the disclosed recursive summation algorithm—can occur using another software program such as Matlab™.

Computer system 300 can operate as a standalone device or can include other computer systems. In a networked deployment, the system 300 may operate in the capacity of a server or a client machine in a server-client network environment, or as a peer machine in a peer-to-peer (or distributed) network environment. The computer system 300 may include a personal computer (PC), a workstation such as those typically used by circuit designers, a set-top box (STB), a Personal Digital Assistant (PDA), a cellular telephone, a web appliance, a network router, switch or bridge, or any machine capable of executing a set of instructions within the software, and networked versions of these.

To provide for interaction with a user, computer system 300 can include a video display 310 for displaying information to the user, and may also include a printer (not shown) for providing hard copies of the results. An alpha-numeric input device 312 (e.g., a keyboard), and a cursor control device 314 (e.g., a mouse) can be used to allow the user to provide input to the computer system. Other input devices may be used as well. Data (such as the magnitudes and durations of the signals; the transfer functions for the channel and transmitter, or their electrical parameters, etc.) can be input to the computer system 300 using such input devices, or such data can be loaded in from memory or from a library within the computer system 300.

The exemplary computer system 300 includes a processor 302 (e.g., a central processing unit (CPU), a graphics processing unit (GPU) or both), a main memory 304 and a static memory 306, which communicate with each other via a bus 308. Processors 302 suitable for the execution of software 324 include both general and special purpose microprocessors, and which may be integrated or distributed in the system 300. Although not shown, there may be more than one processor 302. The memory structures discussed herein ('Vec', 'Sum', 'Out') may be stored in main memory 304, static memory 306, or elsewhere in the computer system 300.

The computer system 300 may further include a disk drive unit 316, which includes a computer-readable medium (e.g., a disk) on which the software 324 is stored. The software 324 may also reside, completely or at least partially, within computer-readable media (e.g., semiconductor memory) in the main memory 304 or within the processor 302 during execution thereof by the computer system 300.

The software 324 and/or its associated data may further be transmitted or received over a network 326 via a network interface device 320 utilizing any one of a number of well-known transfer protocols (e.g., HTTP). Network 326 can comprise a local area network ("LAN"), a wide area network ("WAN"), the Internet, and combinations of these.

The disclosed techniques can also be implemented in digital electronic circuitry, in computer hardware, in firmware, in special purpose logic circuitry such as an FPGA (field programmable gate array) or an ASIC (application-specific integrated circuit), or in combinations of these, which again all comprise examples of computer-readable media. When implemented as software, such software can be written in any form of programming language, and can be deployed in any form, including as a stand-alone program or as a module, component, subroutine, or other unit suitable for use in a computing environment.

Earlier it was explained that the input vector to be assessed with the disclosed recursive summation technique involved a first step of simulation—e.g., simulating the transmission of an ideal pulse (20, FIG. 2) to arrive at a pulse response at the receiver (21, FIG. 2). However, such simulation can also include actual measuring of a pulse response, e.g., with an oscilloscope-type device, which can comprise a part of the computer system 300. "Simulation" as used herein should be understood as including such measurements.

Additionally, simulating the transmission of a signal to determine a signal response at a receiver does not necessarily that the signal being transmitted is on the same channel as the receiver, as would be the case for ISI. For example, and as explained in the above-incorporated '120 application, a signal response on a given channel can occur because of cross talk or simultaneous switching output noise, in which case the perturbing signal may exist on a different channel than that whose receiver is being monitored. As such, the disclosed techniques are equally applicable to assessing the impact of such other perturbing phenomena.

While preferred embodiments of the invention have been disclosed, it should be understood that the disclosed technique can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A non-transitory computer-readable medium which stores a computer program to cause a computer to perform the following method:
processing an input vector having N terms to produce an output vector having $2^N$ terms, the processing using two arguments $Sum_j=0$, and $j=0$ and comprising the following steps:
if j is greater than or equal to N, storing $Sum_j$ as a next term in the output vector; and
if j is not greater than or equal to N,
performing the method again with arguments $Sum_j$, and j+1; and then
performing the method again with arguments $Sum_j$ plus the j-th term in the input vector, and j+1, wherein the input vector comprises a signal response at a receiver, the signal response comprises N terms each representing a voltage at a time i in a unit interval, and the output vector comprises a probability distribution function indicative of the voltages statistically expected at the receiver at time i.

2. A non-transitory computer-readable medium which stores a computer program to cause a computer to perform the following method:
processing an input vector having N terms to produce an output vector, the processing using two arguments $Sum_j=0$, and j=0 and comprising the following steps:
if j is greater than or equal to N,
determining a bin in the output vector corresponding to the value of $Sum_j$; and then
incrementing the corresponding bin in the output vector; and
if j is not greater than or equal to N,
performing the processing method again with arguments $Sum_j$, and j+1; and then
performing the processing method again with arguments $Sum_j$ plus the j-th term in the response, and j+1, wherein the input vector comprises a signal response at a receiver, the signal response comprises N terms each representing a voltage at a time i in a unit interval, and the output vector comprises a probability distribution function indicative of the voltages statistically expected at the receiver at time i.

3. A non-transitory computer-readable medium which stores a computer program to cause a computer to perform the following method:
(a) processing an input vector having N terms to produce a first output vector, the processing using two arguments $Sum_j=0$, and j=0 and comprising the following steps:
if j is greater than or equal to N−1, storing $Sum_j$ as a next term in the first output vector; and
if j is not greater than or equal to N−1,
performing the first processing method again with arguments $Sum_j$, and j+1; and then
performing the first processing method again with arguments $Sum_j$ plus the j+1-th term in the response, and j+1; and
(b) processing the input vector to produce a second output vector, the processing using two arguments $Sum_j$=the j-th term in the response, and j=0 and comprising the following steps:
if j is greater than or equal to N−1, storing $Sum_j$ as a next term in the second output vector; and
if j is not greater than or equal to N−1,
performing the second processing method again with arguments $Sum_j$, and j+1; and then
performing the second processing method again with arguments $Sum_j$ plus the j+1-th term in the response, and j+1, wherein the input vector comprises a signal response at a receiver, the signal response comprises N terms each representing a voltage at a time i in a unit interval, and the first and second output vectors comprise probability distribution functions indicative of the voltages statistically expected at the receiver at time i.

4. The medium of claim 3, wherein steps (a) and (b) occur in parallel in the computer system.

5. The medium of claim 3, wherein the first output vector and the second output vector are concatenated.

6. A simulation method for simulating signals in a computer system, comprising:
- simulating in a computer system the transmission of a signal to determine a signal response at a receiver, wherein the response comprises N terms each taken at a time i in a unit interval;
- processing the response in the computer system to produce an output vector having $2^N$ terms, the processing using two arguments $Sum_j=0$, and $j=0$, the processing method comprising
  - if j is greater than or equal to N, storing $Sum_j$ as a next term in the output vector; and
  - if j is not greater than or equal to N,
    - performing the processing method again with arguments $Sum_j$, and j+1; and then
    - performing the processing method again with arguments $Sum_j$ plus the j-th term in the response, and j+1; and
- binning the values in the output vector to arrive at a probability distribution function indicative of the voltages statistically expected at the receiver at time i.

7. A simulation method for simulating signals in a computer system, comprising:
- simulating in a computer system the transmission of a signal to determine a signal response at a receiver, wherein the response comprises N terms each taken at a time i in a unit interval;
- processing the response in the computer system to produce an output vector having $2^N$ terms, the processing using two arguments $Sum_j=0$, and $j=0$, the processing method comprising
  - if j is greater than or equal to N, storing $Sum_j$ as a next term in the output vector; and
  - if j is not greater than or equal to N,
    - performing the processing method again with arguments $Sum_j$, and j+1; and then
    - performing the processing method again with arguments $Sum_j$ plus the j-th term in the response, and j+1, wherein the method is performed repeatedly for different values of i, and wherein each output vector for each time i is considered together to produce an eye diagram.

8. The method of claim 7, wherein the a bit error ratio is determinable from the eye diagram.

9. The method of claim 7, further comprising determining at least one sensing margin at the receiver from the eye diagram.

10. The method of claim 6, wherein the N terms in the response are not from consecutive unit intervals.

11. A simulation method for simulating signals in a computer system, comprising:
- simulating in a computer system the transmission of a signal to determine a signal response at a receiver, wherein the response comprises N terms each taken at a time i in a unit interval;
- processing the response in the computer system to produce an output vector having number of bins, the processing using two arguments $Sum_j=0$, and $j=0$, the processing method comprising:
  - if j is greater than or equal to N,
    - determining a bin in the output vector corresponding to the value of $Sum_j$; and then
    - incrementing the corresponding bin in the output vector; and
  - if j is not greater than or equal to N,
    - performing the processing method again with arguments $Sum_j$, and j+1; and then
    - performing the processing method again with arguments $Sum_j$ plus the j-th term in the response, and j+1, wherein the output vector comprises a probability distribution function indicative of the voltages statistically expected at the receiver at time i.

12. The method of claim 11, wherein the method is performed repeatedly for different values of i, and wherein each output vector for each time i is considered together to produce an eye diagram.

13. The method of claim 12, wherein the a bit error ratio is determinable from the eye diagram.

14. The method of claim 12, further comprising determining at least one sensing margin at the receiver from the eye diagram.

15. The method of claim 11, wherein the N terms in the response are not from consecutive unit intervals.

16. A simulation method for simulating signals in a computer system, comprising:
- (a) simulating in a computer system the transmission of a signal to determine a signal response at a receiver, wherein the response comprises N terms each taken at a time i in a unit interval;
- (b) processing the response in the computer system to produce a first output vector, the processing using two arguments $Sum_{j=0}$, and $j=0$, the first processing method comprising:
  - if j is greater than or equal to N−1, storing $Sum_j$ as a next term in the first output vector; and
  - if j is not greater than or equal to N−1,
    - performing the first processing method again with arguments $Sum_j$, and j+1; and then
    - performing the first processing method again with arguments $Sum_j$ plus the j+1-th term in the response, and j+1; and
- (c) processing the response in the computer system to produce a second output vector, the processing using two arguments $Sum_j$=the j-th term in the response, and j=0, the second processing method comprising:
  - if j is greater than or equal to N−1, storing $Sum_j$ as a next term in the second output vector; and
  - if j is not greater than or equal to N−1,
    - performing the second processing method again with arguments $Sum_j$, and j+1; and then
    - performing the second processing method again with arguments $Sum_j$ plus the j+1-th term in the response, and j+1, wherein the output vector comprises a probability distribution function indicative of the voltages statistically expected at the receiver at time i.

17. The method of claim 16, wherein steps (a) and (b) occur in parallel in the computer system.

18. The method of claim 16, wherein the first output vector and the second output vector are concatenated.

19. The method of claim 16, wherein the N terms in the response are not from consecutive unit intervals.

* * * * *

UNITED STATES PATENT AND TRADEMARK OFFICE
CERTIFICATE OF CORRECTION

PATENT NO. : 8,510,092 B2
APPLICATION NO. : 12/986280
DATED : August 13, 2013
INVENTOR(S) : Timothy M. Hollis et al.

It is certified that error appears in the above-identified patent and that said Letters Patent is hereby corrected as shown below:

On Title Page, Item (56), under "Other Publications", column 2, line 2, delete "Formuation"" and insert -- Formulation" --, therefor.

In the Claims:

In column 15, line 10, in Claim 6, delete "comprising" and insert -- comprising: --, therefor.

In column 15, line 31, in Claim 7, delete "comprising" and insert -- comprising: --, therefor.

In column 15, line 43, in Claim 8, after "the" delete "a".

Signed and Sealed this
Tenth Day of December, 2013

Margaret A. Focarino
*Commissioner for Patents of the United States Patent and Trademark Office*